*US011637191B2*

United States Patent
Gosavi et al.

(10) Patent No.: US 11,637,191 B2
(45) Date of Patent: Apr. 25, 2023

(54) PIEZO-RESISTIVE TRANSISTOR BASED RESONATOR WITH FERROELECTRIC GATE DIELECTRIC

(71) Applicant: Intel Corporation, Santa Clara, CA (US)

(72) Inventors: Tanay Gosavi, Hillsboro, OR (US); Chia-ching Lin, Portland, OR (US); Raseong Kim, Portland, OR (US); Ashish Verma Penumatcha, Hillsboro, OR (US); Uygar Avci, Portland, OR (US); Ian Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 961 days.

(21) Appl. No.: 16/238,420

(22) Filed: Jan. 2, 2019

(65) Prior Publication Data
US 2020/0212194 A1 Jul. 2, 2020

(51) Int. Cl.
*H01L 29/51* (2006.01)
*H01L 29/78* (2006.01)
*H01L 27/088* (2006.01)
*H03H 9/17* (2006.01)
*H01L 29/423* (2006.01)

(52) U.S. Cl.
CPC ........ *H01L 29/516* (2013.01); *H01L 27/0886* (2013.01); *H01L 29/42356* (2013.01); *H01L 29/7851* (2013.01); *H01L 29/78391* (2014.09); *H03H 9/17* (2013.01)

(58) Field of Classification Search
CPC combination set(s) only.
See application file for complete search history.

(56) References Cited

U.S. PATENT DOCUMENTS

| | | | |
|---|---|---|---|
| 9,663,346 B1 * | 5/2017 | Bahr | ..................... H01L 29/785 |
| 10,020,360 B1 | 7/2018 | Ramaswamy et al. | |
| 2017/0103988 A1 * | 4/2017 | Nishida | ............... H01L 29/6684 |
| 2017/0222126 A1 * | 8/2017 | Krivokapic | ....... H01L 29/78391 |
| 2017/0287979 A1 | 10/2017 | Manipatruni et al. | |
| 2019/0267328 A1 | 8/2019 | Fumagalli et al. | |
| 2019/0386637 A1 * | 12/2019 | Plesski | ................... H03H 9/564 |
| 2020/0105773 A1 | 4/2020 | Morris et al. | |

(Continued)

FOREIGN PATENT DOCUMENTS

| | | |
|---|---|---|
| DE | 112015001507 | 12/2016 |
| WO | 2019005143 | 1/2019 |

*Primary Examiner* — Moin M Rahman
*Assistant Examiner* — Mohammad A Rahman
(74) *Attorney, Agent, or Firm* — Essential Patents Group, LLP

(57) ABSTRACT

Describe is a resonator that uses ferroelectric (FE) materials in the gate of a transistor as a dielectric. The use of FE increases the strain/stress generated in the gate of the FinFET. Along with the usual capacitive drive, which is boosted with the increased polarization, FE material expands or contacts depending on the applied electric field on the gate of the transistor. As such, acoustic waves are generated by switching polarization of the FE materials. In some embodiments, the acoustic mode of the resonator is isolated using phononic gratings all around the resonator using the metal line above and vias' to body and dummy fins on the side. As such, a Bragg reflector is formed above the FE based transistor.

25 Claims, 29 Drawing Sheets

(56) References Cited

U.S. PATENT DOCUMENTS

| | | |
|---|---|---|
| 2020/0212194 A1 | 7/2020 | Gosavi et al. |
| 2020/0212532 A1 | 7/2020 | Gosavi et al. |
| 2020/0411695 A1* | 12/2020 | Sung ................ H01L 29/78391 |
| 2021/0305398 A1 | 9/2021 | Chang et al. |

* cited by examiner

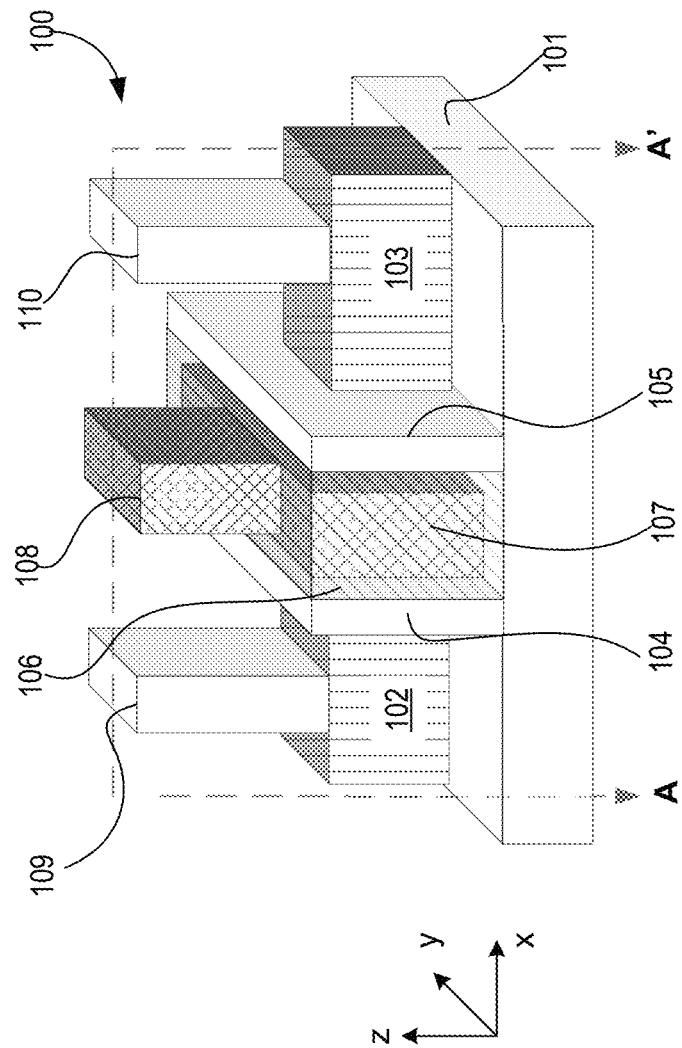
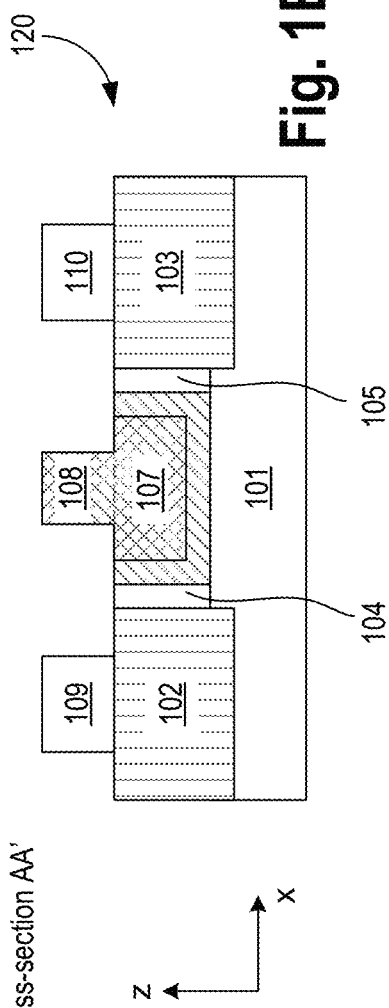
Fig. 1A
Fig. 1B

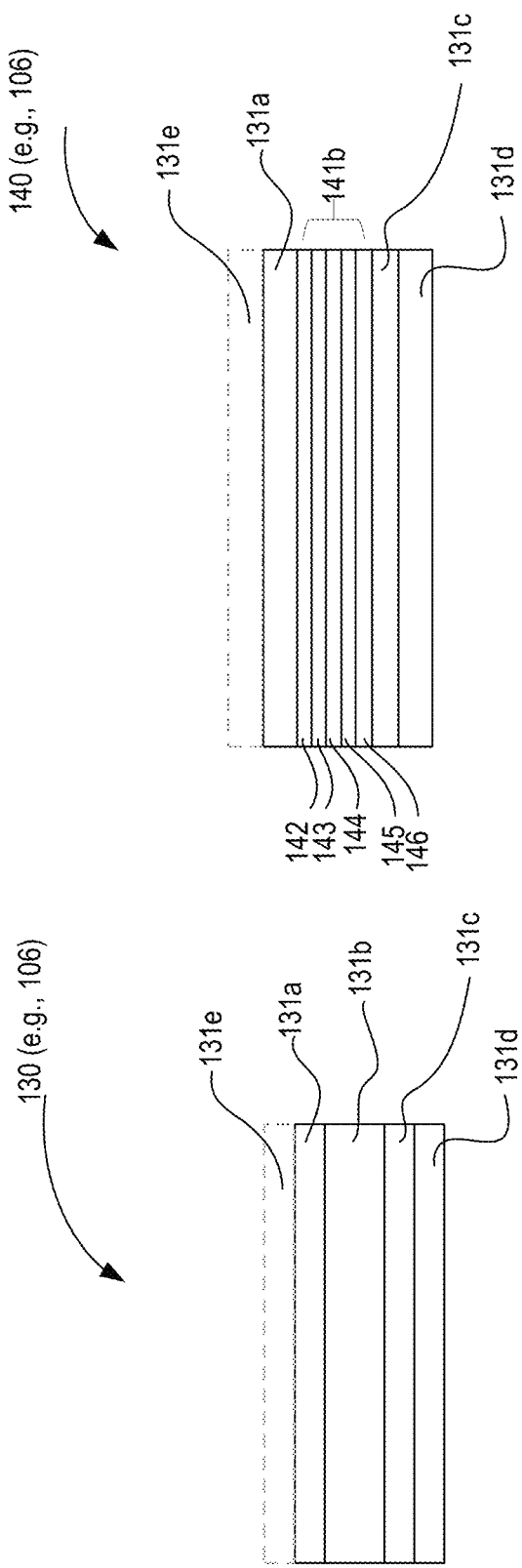

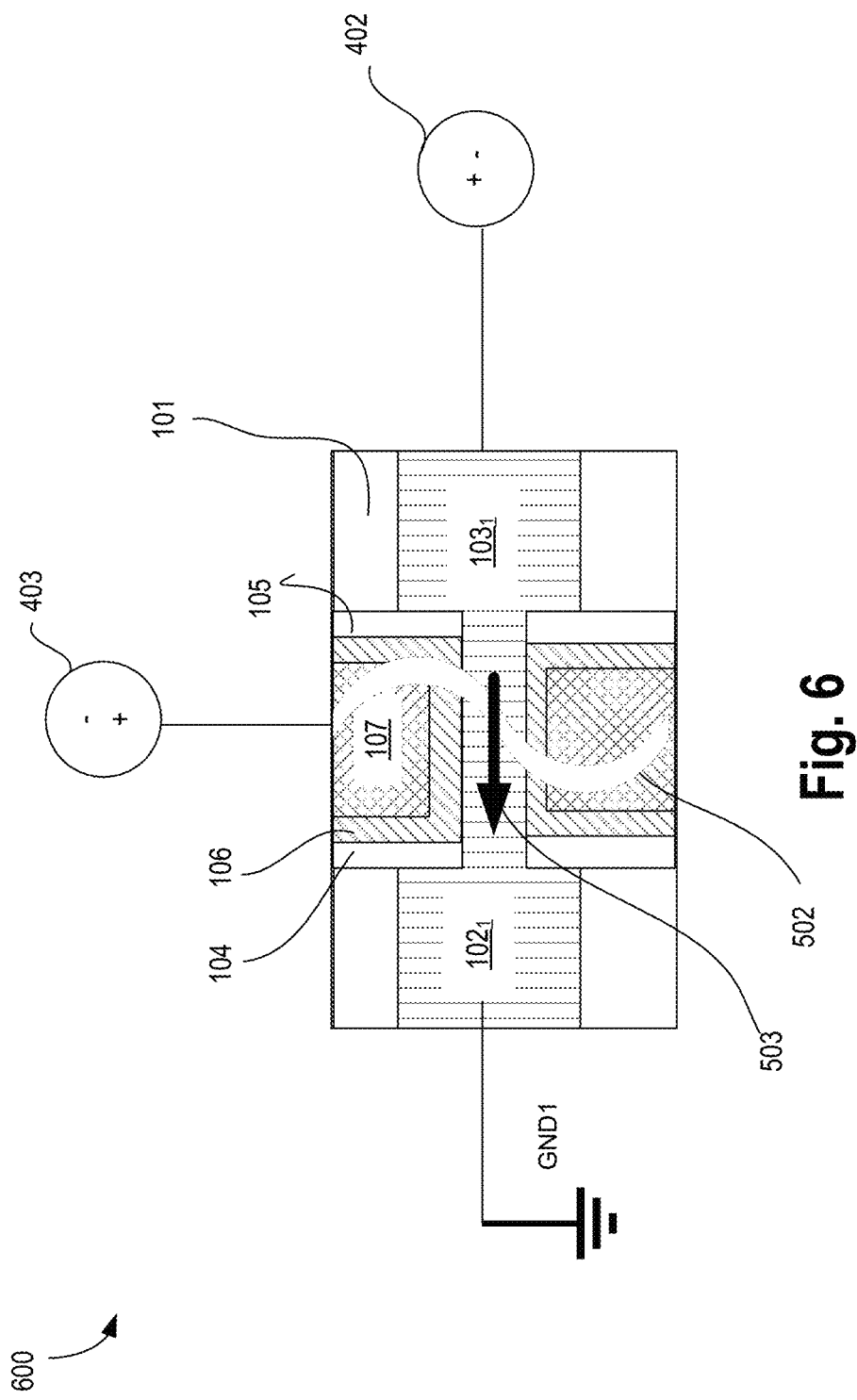

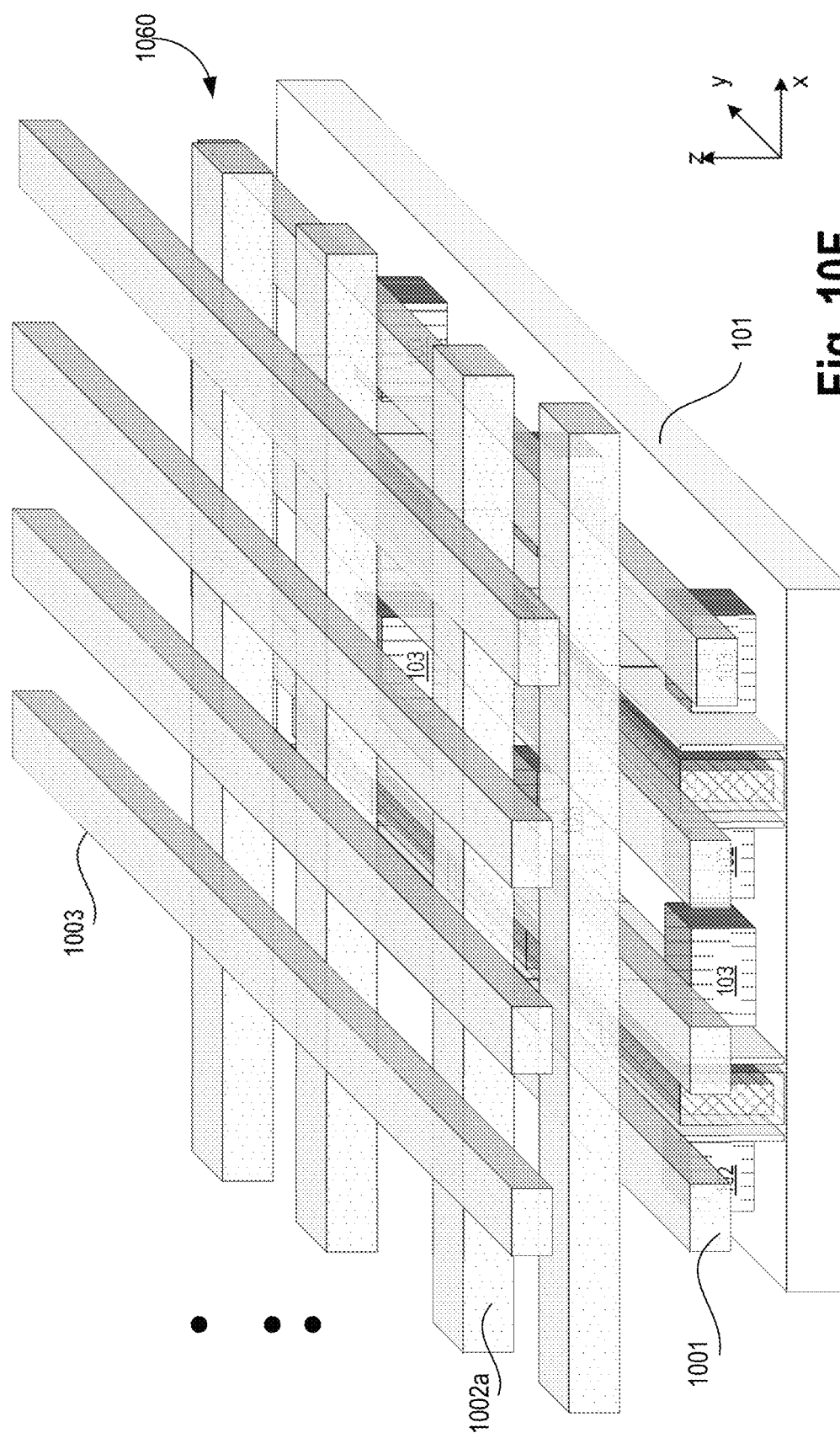

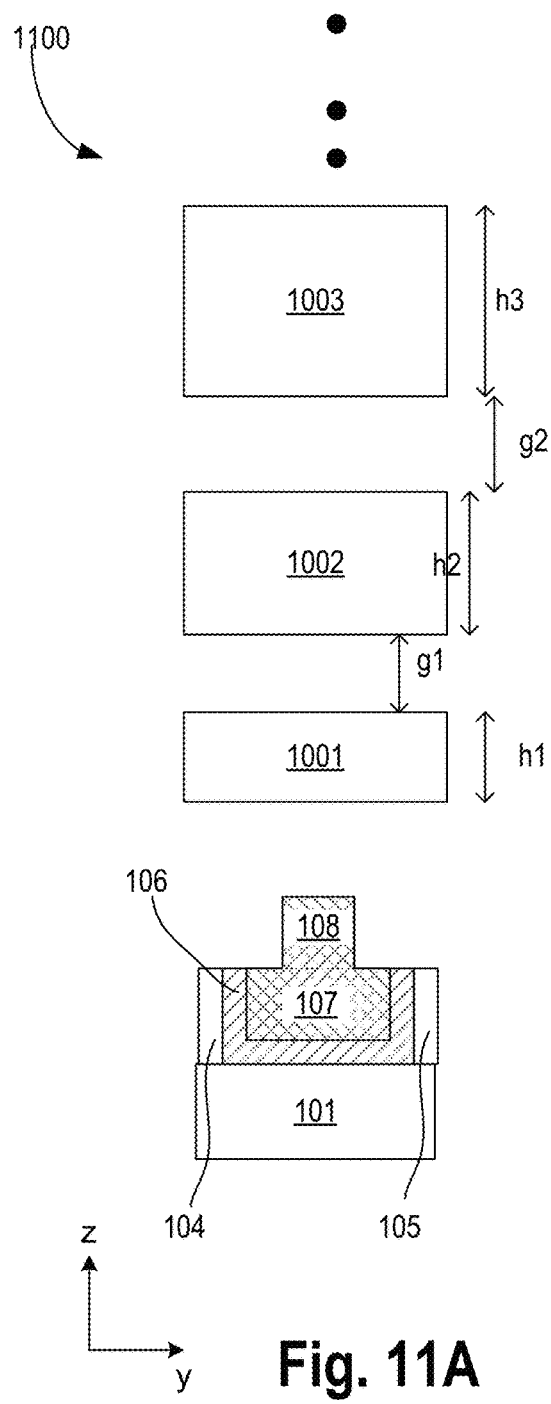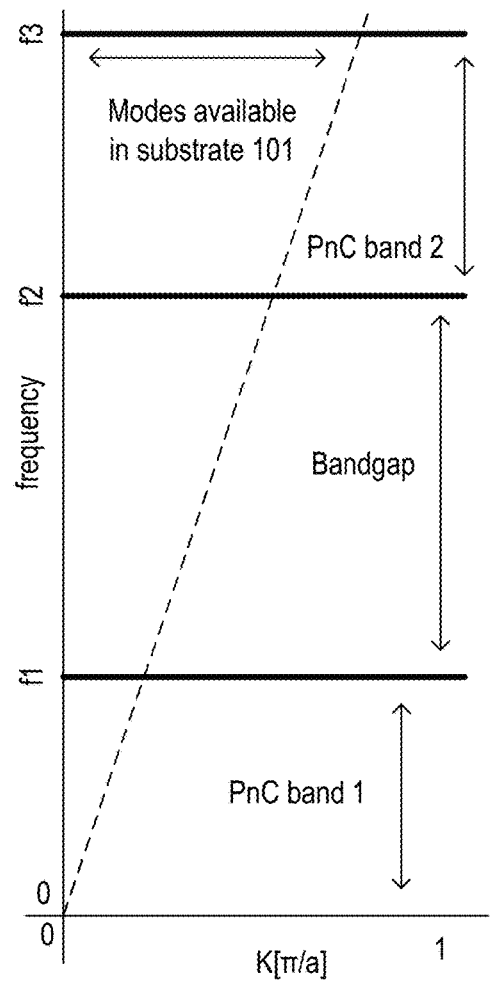
Fig. 11A
Fig. 11B

PIEZO-RESISTIVE TRANSISTOR BASED RESONATOR WITH FERROELECTRIC GATE DIELECTRIC

BACKGROUND

An oscillator may include an electric circuit that produces a periodically varying output at a controlled frequency. Filters may be implemented in circuits that selectively pass certain elements of a signal while eliminating other elements of the signal. A resonator may include circuitry that exhibits resonant behavior (e.g., naturally oscillates at resonant frequencies with greater amplitude than at other non-resonant frequencies). Oscillators, filters, resonators and the like may use quartz crystal, inductors, and/or capacitors to generate or promote certain signal frequencies. Clocking circuits and communication circuits in current Complementary Metal Oxide Semiconductor (CMOS) chips rely on using LC (inductor-capacitor) voltage controlled oscillators in phased lock loops (PLLs) with an external crystal oscillator signal. Use of inductors creates challenges in scaling the circuits down. Inductors also cause cross-coupling between different circuits and they have poor yield. Inductor-less oscillator circuits are needed to integrate multiple frequencies on CMOS chips and scale the size of the chips further. On the other hand, an on-chip high performance oscillator can also get rid of external clock references, which makes the packaging of mobile systems challenging and needs extra signal power.

Conventional oscillators, filters, resonators and the like may use quartz crystal, inductors, and/or capacitors to generate or promote certain signal frequencies. Such components can be expensive, unstable, and/or have too large of a footprint (making them less suitable for inclusion on, for example, a "system on a chip" (SoC) that may include logic circuits as well). These shortcomings are becoming more critical considering the need for oscillators, filters, and resonators is increasing. For example, the number of frequency bands in a wireless system is growing, and consequently so is the number of required filters. Conventional resonators, such as film bulk acoustic resonators (FBAR), are not integrated with major components of wireless systems, such as complementary metal-oxide-semiconductor (CMOS) radio frequency (RF) transceiver circuits. Due to this non-integration, the circuits require special packaging, which is costly in terms of real estate and finances.

The background description provided herein is for the purpose of generally presenting the context of the disclosure. Unless otherwise indicated herein, the materials described in this section are not prior art to the claims in this application and are not admitted to be prior art by inclusion in this section.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 1A illustrates a tri-gate transistor with ferroelectric (FE) material in the gate of the transistor, in accordance with some embodiments of the disclosure.

FIG. 1B illustrates a cross-section of the tri-gate transistor with FE material in the gate of the transistor, in accordance with some embodiments of the disclosure.

FIG. 1C illustrates a cross-section of a material stack used for forming a ferroelectric layer, according to some embodiments.

FIG. 1D illustrates a cross-section of a super-lattice material stack used for forming a ferroelectric layer, according to some embodiments.

FIG. 6 illustrates sensing in the FE based resonator, in accordance with some embodiments.

FIGS. 10A-G illustrates acoustic waveguides, respectively, with Bragg reflectors adjacent to a multi-gate transistor having FE material, in accordance with some embodiments.

FIGS. 11A-B illustrate plots, respectively, showing formation of acoustic phononic crystals above the multi-gate transistor having FE material, in accordance with some embodiments.

DETAILED DESCRIPTION

Figure 1E:
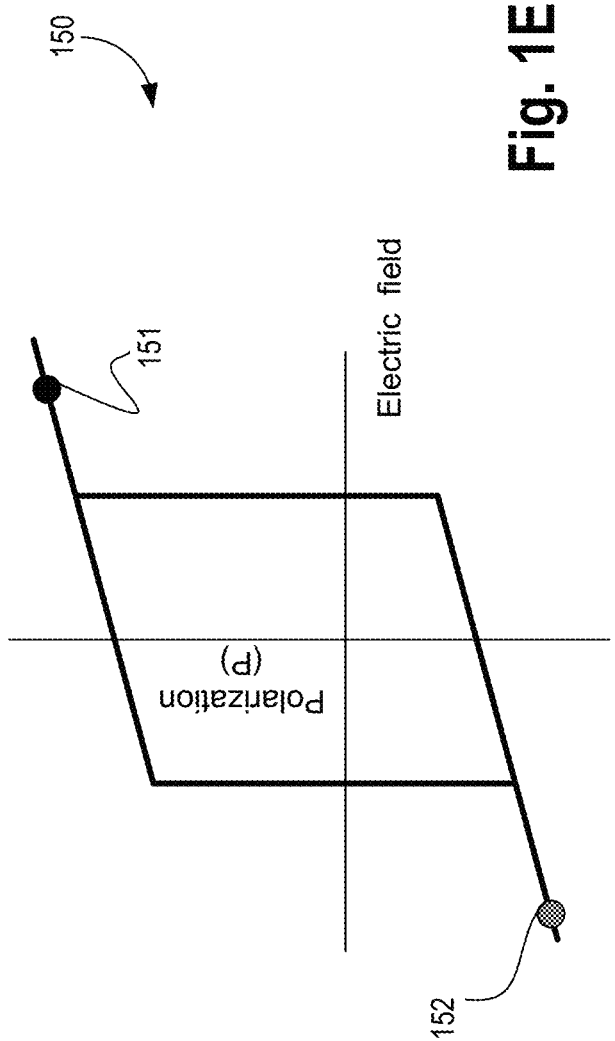
FIG. 1E illustrates plot showing hysteresis property of ferroelectric material, in accordance with some embodiments.

Some embodiments use ferroelectric materials in the gate of a transistor as a dielectric, which is connected to other transistors for its use as a resonator. The transistors can be a planar Field Effect Transistor (FET) or a non-planar transistor or a combination of both. Nonplanar transistors include FinFET transistors such as double-gate transistors and tri-gate transistors, and wrap-around or all-around gate transistors such as nanoribbon and nanowire transistors. Other transistors within the scope of various embodiments include Tunneling FET (TFET), Square Wire, or Rectangular Ribbon Transistors, ferroelectric FET (FeFETs), or other devices implementing transistor functionality like carbon nanotubes or spintronic devices. Metal Oxide Semiconductor (MOSFET) have symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors (BJT PNP/NPN), BiCMOS, CMOS, etc., may be used without departing from the scope of the disclosure.

In some embodiments, an apparatus (e.g., a resonator) comprises: a first nonplanar transistor (e.g., FinFET1) including a first fin that includes first source and drain regions, and a first channel between the first source and drain regions. In some embodiments, the resonator comprises a second nonplanar transistor including a second fin that includes second source and drain regions, and a second channel between the second source and drain regions; and a nonplanar gate on the first fin between the first source and drain regions and on the second fin between the second source and drain regions, wherein the nonplanar gate includes ferroelectric (FE) gate dielectric.

The FE material may be formed from any appropriate ferroelectric material. In one embodiment, the ferroelectric material comprises hafnium and oxygen, such as hafnium oxide. The hafnium oxide can be doped, for example by silicon, zirconium, lanthanum, aluminum, and the like, and may have dopant concentrations between about 3% and 30% by weight. The ferroelectric material can be formed by well-known techniques, such as by depositing a gate electrode material, such as atomic layer deposition ("ALD"). In some embodiments, the FE gate dielectric includes one lead zirconate titanate, lead titanate, barium titanate, and hafnium oxide, any of which may be doped or undoped. In some embodiments, the dopant includes one of: Si, Co, or Al. In some embodiments, the FE gate dielectric has a thickness of at least 5 atomic percent. In some embodiments, the apparatus comprises a gate electrode on the FE dielectric, wherein the gate electrode comprises one or more of: Ti, N, or Al.

In some embodiments, the apparatus comprises: a direct current (DC) contact, to receive a DC current, coupled to the gate electrode and further coupled to at least one of the first and second fins. In some embodiments, the apparatus comprises: an alternating current (AC) contact, to receive an AC current, coupled to at least one of the gate electrode, the first fin, and the second fin. In some embodiments, the first and second fins are not coupled to any other gate between the first source and drain regions.

In some embodiments, the DC contact couples to the first fin and the AC contact couples to the gate. In some embodiments, the gate electrode mechanically resonates at a first frequency when the gate is actuated with the AC current, from the AC contact, to generate periodic forces on the gate electrode. In some embodiments, the apparatus comprises a circuitry to sense the first frequency based on the DC current to the first fin when the gate resonates. In some embodiments, the DC and AC contacts each couple to the first fin. In some embodiments, the DC contact couples to the first and second fins and the AC contact couples to the gate. In some embodiments, the DC contact couples to the second fin and the AC contact couples to the first fin. In some embodiments, the apparatus comprises AC and DC sources that respectively couple to the AC and DC contacts to provide the AC and DC currents. In some embodiments, the apparatus comprises a layer of metals extending parallel to one another, wherein the layer of metals is above the first and second non-planar transistors such as to form a Bragg reflector. In some embodiments, the layer of metals is unbiased.

The use of FE material increases the strain/stress generated in the gate of the FinFET. Along with the usual capacitive drive, which is boosted with the increased polarization, the expansion and contraction of FE material due to the piezoelectric response causes acoustic waves to be generated. This mode of operation is referred to as the acoustic mode. In some embodiments, the acoustic mode of the resonator is isolated using phononic gratings all around the resonator using the metal line above and vias' to body and dummy fins on the side.

By applying voltage across the gate the FE oxide, the FE can be "pulled" to one side of the hysterics or other. By favoring one side of polarization, the voltage response to strain changes from expansion to compression. The change in the acoustic mode changes the frequency of operation as well.

There are many technical effects of the various embodiments. For example, the FE gate dielectric based transistors organized in an array with metal wires above, below, and/or on the sides of the transistors allows for an acoustic waveguide made inside an integrated circuit die. The resonator and/or oscillators made from the FE gate dielectric based transistors allows for further scaling of CMOS clock networks and communication chips. The resonator and/or oscillators made from the FE gate dielectric based transistors enables new applications like on-chip band-pass filters, notch filters, high-frequency oscillators and other RF components like circulators and isolators. The resonator and/or oscillators made from the FE gate dielectric based transistors enables components for creating neuromorphic coupled oscillator systems. Due to a high quality factor of MEMS (micro-electro-mechanical system) devices, the transistors of various embodiments can enable low jitter high-performance circuits. Some embodiments provide improvements over on-chip resonators that use resonant body transistors (RBT). Other technical effects will be evident from the various figures and embodiments.

The change in the acoustic mode changes the frequency of operation and that enables the resonator array to be frequency programmable. Such resonator has many applications that can be used in CMOS/RF circuits. Due to typically large quality factors (QF) of the MEMS (Micro Mechanical Electrical Systems) acoustic resonators, the jitter and phase noise performance of the oscillators based on these resonators have much better performance (e.g., higher QF). Other applications can be bandpass or notch filters. Based on FE materials, the piezoelectric coefficients of the materials is large and hence have high transduction efficiency than typical capacitive versions.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, multiple non-silicon semiconductor material layers may be stacked within a single fin structure. The multiple non-silicon semiconductor material layers may include one or more "P-type" layers that are suitable (e.g., offer higher hole mobility than silicon) for P-type transistors. The multiple non-silicon semiconductor material layers may further include one or more "N-type" layers that are suitable (e.g., offer higher electron mobility than silicon) for N-type transistors. The multiple non-silicon semiconductor material layers may further include one or more intervening layers separating the N-type from the P-type layers. The intervening layers may be at least partially sacrificial, for example to allow one or more of a gate, source, or drain to wrap completely around a channel region of one or more of the N-type and P-type transistors. The multiple non-silicon semiconductor material layers may be fabricated, at least in part, with self-aligned techniques such that a stacked CMOS device may include both a high-mobility N-type and P-type transistor with a footprint of a single finFET.

Here, the term "backend" generally refers to a section of a die which is opposite of a "frontend" and where an IC (integrated circuit) package couples to IC die bumps. For example, high level metal layers (e.g., metal layer 6 and above in a ten-metal stack die) and corresponding vias that are closer to a die package are considered part of the backend of the die. Conversely, the term "frontend" generally refers to a section of the die that includes the active region (e.g., where transistors are fabricated) and low-level metal layers and corresponding vias that are closer to the active region (e.g., metal layer 5 and below in the ten-metal stack die example).

It is pointed out that those elements of the figures having the same reference numbers (or names) as the elements of any other figure can operate or function in any manner similar to that described, but are not limited to such.

FIG. 1A illustrates a tri-gate transistor 100 with ferroelectric (FE) material in the gate of the transistor, in accordance with some embodiments of the disclosure. FIG. 1B illustrates a cross-section 120 of the tri-gate transistor with FE material in the gate of the transistor, in accordance with some embodiments of the disclosure.

So as not to obscure the various embodiments, the transistor described herein is a tri-gate transistor or a FinFET. However, the embodiments are generally applicable to other types of transistors. In some embodiments, the tri-gate transistor (or FinFET) 100 is fabricated on a substrate 101. The FinFET 100 comprises source region 102 and drain region 103 coupled to a channel (not shown) of a fin. The gate is formed over the fin and comprises spares 104 and 105, FE material 106 (e.g., FE dielectric), and gate electrode 107. The gate electrode is further coupled to gate contact 108. The source region 102 and drain region 103 are connected to contacts 109, and 110, respectively. Spacers 104 and 105 are located between gate 107 and the source/drain regions, which are on top of layer 101. The fin is the thin strip of semiconductor material that is orthogonal to the gate. The fin is formed on layer 101.

Layer 101 may be a substrate, oxide, and the like. The fin may be formed from the substrate 101. In some embodiments, substrate 101 includes a suitable semiconductor material such as but not limited to, single crystal silicon, polycrystalline silicon and silicon on insulator (SOI), or similar substrates formed of other semiconductor materials such as germanium, silicon germanium or a suitable group III-V compound.

The source and drain regions 102 and 103, respectively, are highly doped (with epitaxial growth in some embodiments). A conductive channel of the finFET resides on the outer sides of the fin beneath the FE gate dielectric 108. Current runs along both "sidewalls" of the fin as well as along the top side of the fin. Because the conductive channel essentially resides along the three different outer, planar regions of the fin, the particular finFET of FIG. 1A is typically referred to as a "tri-gate" finFET. Other types of finFETs exist (such as "double-gate" finFETs, which are included in other embodiments and in which the conductive channel principally resides only along both sidewalls of the fin and not along the top side of the fin).

As shown, source structure 102 and drain structure 103 are within substrate 101 adjacent to gate electrode 107 and FE 106 of transistor 100. In some embodiments, source structure 102 and drain structure 103 extend under dielectric spacer 104. The dielectric spacer 104 may include a material such as but not limited to, silicon nitride, carbon doped silicon nitride, silicon oxynitride, or silicon carbide.

Source structure 102 and drain structure 103 may include epitaxially deposited materials that depend on the type of substrate 106. In some embodiments, source structure 102 and drain structure 103 include a silicon alloy such as silicon germanium or silicon carbide and substrate 101 includes silicon. In some embodiments, the silicon alloy may include dopants such as boron, arsenic, or phosphorous. In some embodiments, the source structure 102 and drain structure 103 include one or more alternate semiconductor materials such as doped-germanium or a group III-V material or alloy.

In an embodiment, gate contact 108, source contact 109, and drain contact 110, include a material such as but not limited to tungsten, titanium, gold, scandium or graphene. In some embodiments, gate contact 108, source contact 109, and drain contact 110 may include a contact adhesion layer. In some embodiments, the contact adhesion layer is chosen to minimize barrier height for optimizing electron and hole conduction between source and drain contacts 106 and 110 and source and drain structures 102 and 103, respectively. Examples of such adhesion layers include Ti or Ni. The thickness of the adhesion layer can range from 3-10 nm (nanometers).

In some embodiments, in isolation (not shown) is adjacent to the source 102 and drain 103 in a recess in the substrate 101. In some embodiments, the isolation includes any material that has sufficient dielectric strength to provide electrical isolation such as, but not to, limited silicon dioxide, silicon nitride, silicon oxynitride, carbon doped nitride and carbon doped oxide. In some embodiments, a dielectric (e.g., an oxide) is fabricated on the isolation, on the source 102, drain 103 and adjacent to the source contact 108, drain contact 110, gate contact 108 and the dielectric spacer 105.

In some embodiments, FE 106 is a dielectric layer which is crystalline and includes oxygen and a dopant. FE is utilized as a gate dielectric layer 106 to provide excess charge through the principle of electric polarization. FE 106 exhibits two stable multiple operating positions along its polarization vs. electric field hysteresis loop. These two stable operating positions are 1) with positive electric field and positive polarization, and 2) with negative electric field and negative polarization. In FE 106, the polarization can be switched by applying an AC voltage across FE 106. By switching the polarization, the strain response of FE 106 changes. By changing the strain response, the gate having FE 106 can physically expand or contract. For example, the gate can expand outwards or inwards along the x-direction (or y-direction) or the x-y plane of the device. This expansion and contraction causes resonation, and forms the basis of a resonator.

The ferroelectric material 106 may be formed from any appropriate ferroelectric material. In one embodiment, the ferroelectric material 106 comprises hafnium and oxygen, such as hafnium oxide. The hafnium oxide can be doped, for example by silicon, zirconium, lanthanum, aluminum, and the like, and may have dopant concentrations between about 3 and 30% by weight. The ferroelectric material 106 can be formed by well-known techniques, such as by depositing a gate electrode material, such as atomic layer deposition ("ALD").

In some embodiments, FE dielectric layer 106 is also adjacent to a gate dielectric (not shown here, but shown in FIG. 806 in FIG. 8D) which may be between FE dielectric layer 106 and gate electrode 107. In some embodiments, FE dielectric layer 106 is between gate dielectric and gate electrode 107. In either case, in some embodiments, gate dielectric may be formed from any well-known gate dielectric material, including but not limited to silicon dioxide ($SiO_2$), silicon oxynitride ($SiO_xN_y$), silicon nitride ($Si_3N_4$), and high-k dielectric materials such as hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. The gate dielectric layer can be formed by well-known techniques, such as by depositing a gate electrode material, such as chemical vapor deposition ("CVD"), physical vapor deposition ("PVD"), and atomic layer deposition ("ALD").

When a drain bias is applied to the transistor 100 via drain contact 110, and the gate bias on contact 108 is above a threshold voltage for current to flow in the channel, the charge induced by the polarized electric field augments the drive current in the transistor. The direction of the induced electric field in the FE gate dielectric layer 106 depends on the polarity of the applied gate bias. As such, an FE gate dielectric layer 106 can be readily adapted to complimentary CMOS logic transistor applications.

FIG. 1C illustrates a cross-section of a material stack 130 (e.g., 106) used for forming a ferroelectric layer 106, according to some embodiments. In some embodiments, ferroelectric material 106 comprises a stack of layers including first conductive layer 131a, a layer 131b comprising perovskite, a second conductive layer 131c, and a conductive seed layer 131d. In some embodiments, first and second conductive layers 131a/c are conductive oxides that include one of the following elements: Sr, Ru, La, Sr, Mn, Nb, Cr, or O. In some embodiments, first and second conductive layers 131a/c are conductive oxides which comprise: $SrRuO_3$, (La,Sr)$CoO_3$ [LSCO], $La_{0.5}Sr_{0.5}Mn_{1-x}Ni_xO$, Cu-doped $SrFe_{0.9}Nb_{0.1}O_3$, (La,Sr)$CrO_3$.

In some embodiments, layer 141 comprising perovskite is sandwiched between first and second conductive layers 131a/c such that layer 132b is adjacent to first and second conductive layers 131a/c. In some embodiments, layer 132b comprises a low leakage perovskite. Perovskites have cubic structure with a general formula of $ABO_3$, where 'A' includes one of an alkaline earth or rare earth element (e.g., Sr, Bi, Ba, etc.) while 'B' is one of a 3d, 4d, or 5d transition metal element (e.g., Ti, Fe, etc.). In some embodiments, layer 132b includes one of $SrTiO_3$, $BiFeO_3$, $BiTiO_3$, or $BaTiO_3$.

In some embodiments, a seed layer (or starting layer) 131d is deposited first and then layers 131c, 131b, 131a are deposited. In some embodiments, the seed layer 131d is used to template the conductive layer 131c. In some embodiments, a seed layer 131e is deposited in addition to or instead of 131d. In some embodiment seed layer 131d/e includes one of: Ti, Al, Nb, La, or STO ($SrTiO_3$). In some embodiments, seed layer 131d/e includes one of: TiAl, Nb doped STO, or La doped STO.

In some embodiments, the FE material 106 includes $HfO_2$ based ferroelectric oxides. In some embodiments, FE material include $HfO_2$ doped with one of Si, Al, Zr, Ti, Sc, Ge, Nb, etc. FE material 106 also includes $HfO_2$ based material that are generated in pure $HFO_2$ with orthorhombic phase. The thickness (along the z-direction) of the FE material can be in the range of 0.5 nm to 15 nm. In some embodiments, the thickness (along the z-direction) of the FE material 106 can be about 100 nm.

FIG. 1D illustrates a cross-section of a super-lattice material stack 140 used for forming a ferroelectric layer 106, according to some embodiments. In some embodiments, perovskite layer 131b is replaced by super lattice 131b. In some embodiments, super lattice 141b includes alternating layers of materials. For example, layer 142 comprises $PbTiO_3$, layer 143 comprises $SrTiO_3$, layer 144 comprises $PbTiO_3$, layer 145 comprises $SrTiO_3$, layer 146 comprises $PbTiO_3$, and so on (e.g., 2 to 100 times). In some embodiments, one layer can be a non-polar oxide of the type ($A^{+2}B^{+4}O_3$) such as $SrZrO_3$, and another layer can be a polar oxide of the type ($A^{+1}B^{+5}O_3$ or $A^{+3}B^{+3}O_3$) such as $LaAlO_3$ and $LaGaO_3$, where 'A' can comprise one of: La, Sr, Pb, Pr, Nd, Sm, Gd, Y, Tb, Dy, Ho, Er, Tm, Lu, Ce, Li, Na, K, Rb, or Ag, and 'B' can comprise Ga, Al, Sc, In, Ta, Ti, or Zr.

As more alternating layers of $PbTiO_3$ and $SrTiO_3$ are added, the capacitor can store more charge. In some embodiments, the two or more layers of super lattice 131b has a thickness that extends from the first metal layer 131a to the second metal layer 131c. In some embodiments the thickness (along the z-direction) is in a range of 1 nm (nanometers) to 15 nm. In some embodiments, the two or more layers of super lattice 131b have a width which is perpendicular to the thickness, and wherein the width is in a range of 5 nm to 100 nm. In some embodiments, the super lattice is formed with PTO/STO (e.g., repeated 2 to 100 times) for capacitance enhancement. In some embodiments, the super lattice comprises of materials with improper ferroelectricity (e.g., STO/PTO, $LuFeO_3$/$LuFe_2O_4$).

In some embodiments, gate electrode 107 has a work function in the range of 3.8 eV-4.5 eV. Similar to traditional MOSFETs, the work function of gate electrode 107 in transistor 100 may be tuned to optimize threshold voltage. Depending on whether transistor 100 is an N-channel MOSFET or a P-channel MOSFET, gate electrode 107 may include a P-type work function metal or an N-type work function metal to provide transistor 100 as a PMOS or an NMOS transistor.

For a PMOS transistor, metals that may be used for gate electrode layer 107 include, but are not limited to, ruthenium, palladium, platinum, cobalt, nickel, and conductive metal oxides, e.g., ruthenium oxide. A P-type metal layer may enable the formation of a PMOS gate electrode 107 with a work function between about 4.9 eV and about 5.2 eV. For an NMOS transistor, metals that may be used for gate electrode 107 include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer may enable the formation of an NMOS gate electrode with a work function that is between about 3.9 eV and about 4.2 eV.

In some embodiments, gate electrode 107 includes a gate material such as but not limited to titanium nitride, tantalum nitride, and titanium aluminum nitride. In some embodiments, gate electrode 107 includes a stack of two or more conductive layers, where a first conductive layer that is directly on FE gate dielectric layer 106 sets the work function of gate electrode 107, and the remaining one or more conductive layers include fill layers. In the illustrative embodiment, FE gate dielectric layer 106 includes a portion on a sidewall of the gate electrode 107.

In some embodiments, gate electrode 107 includes titanium nitride, FE gate dielectric layer 106 includes hafnium and oxygen and a silicon dopant, and gate electrode 110 and FE gate dielectric layer 102 each have a tetragonal crystal structure. In some embodiments, gate electrode 107 includes titanium nitride, FE gate dielectric layer 106 includes zirconium and oxygen and a cobalt dopant.

FIG. 1E illustrates plot 150 showing hysteresis property of ferroelectric material 106, in accordance with some embodiments. A ferroelectric material exhibits ferroelectricity which is a property by which a spontaneous electric polarization can be revered by an electric field (e.g., applied voltage). When dielectric materials are polarized, the induced polarization 'P' is almost exactly proportional to the applied external electric field E. In such materials, the polarization is a linear function of the applied electric field or voltage. Ferroelectric materials, on the other hand, demonstrate a spontaneous non-zero polarization even when the applied electric field E is zero. As such, the spontaneous polarization can be reversed by an applied electric field in the opposite direction. This results in a hysteresis loop because the polarization of a ferroelectric material is dependent not only on the present electric field but also on its history. The hysteresis loop of plot 150 shows two stable operating positions for FE 106—position 151 and position 152.

These two stable positions indicate that the direction of polarization can be switched (e.g., polled) from one to another and this changes the response of polarization to applied AC voltage. The switching of polarization modifies the strain response to applied voltage or electric field, and as such the ferroelectric capacitor formed by ferroelectric material 106 can physically expand or contract. The expansion and contraction along the x-axis is shown by indicator 161. For example, at operating point 151 on the hysteresis plot 150, FE material 106 expands while at operating point 152 on the hysteresis plot 150, FE material 106 contracts.

Figure 1F:
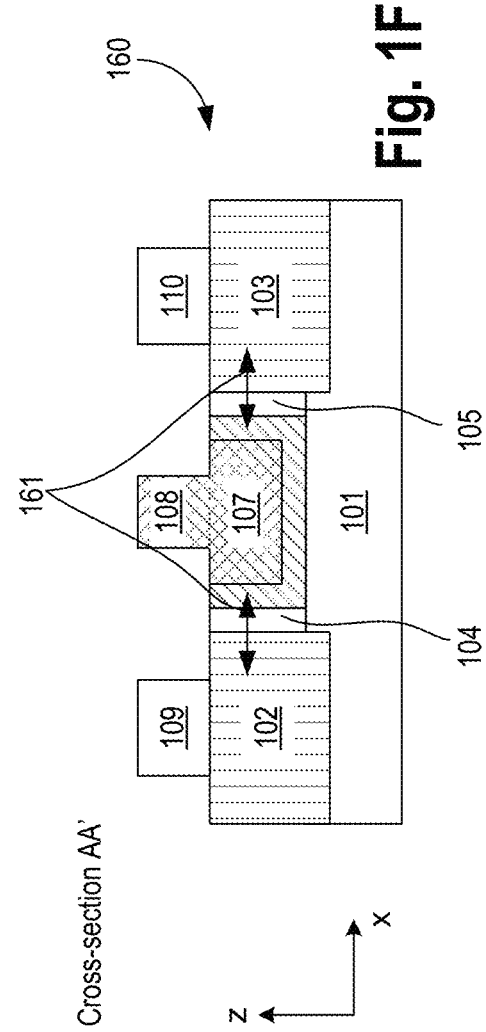
FIG. 1F illustrates a cross-section of the tri-gate with FE material in the gate and resonating due to strain from FE material, in accordance with some embodiments.

FIG. 1F illustrates a cross-section 160 of the tri-gate with FE material in the gate and resonating due to strain from FE material, in accordance with some embodiments. By application of voltage on the gate 108, FE material 106 can exert strain due to switching polarization. This strain causes the FE material 106 to expand or contract.

Figure 2:
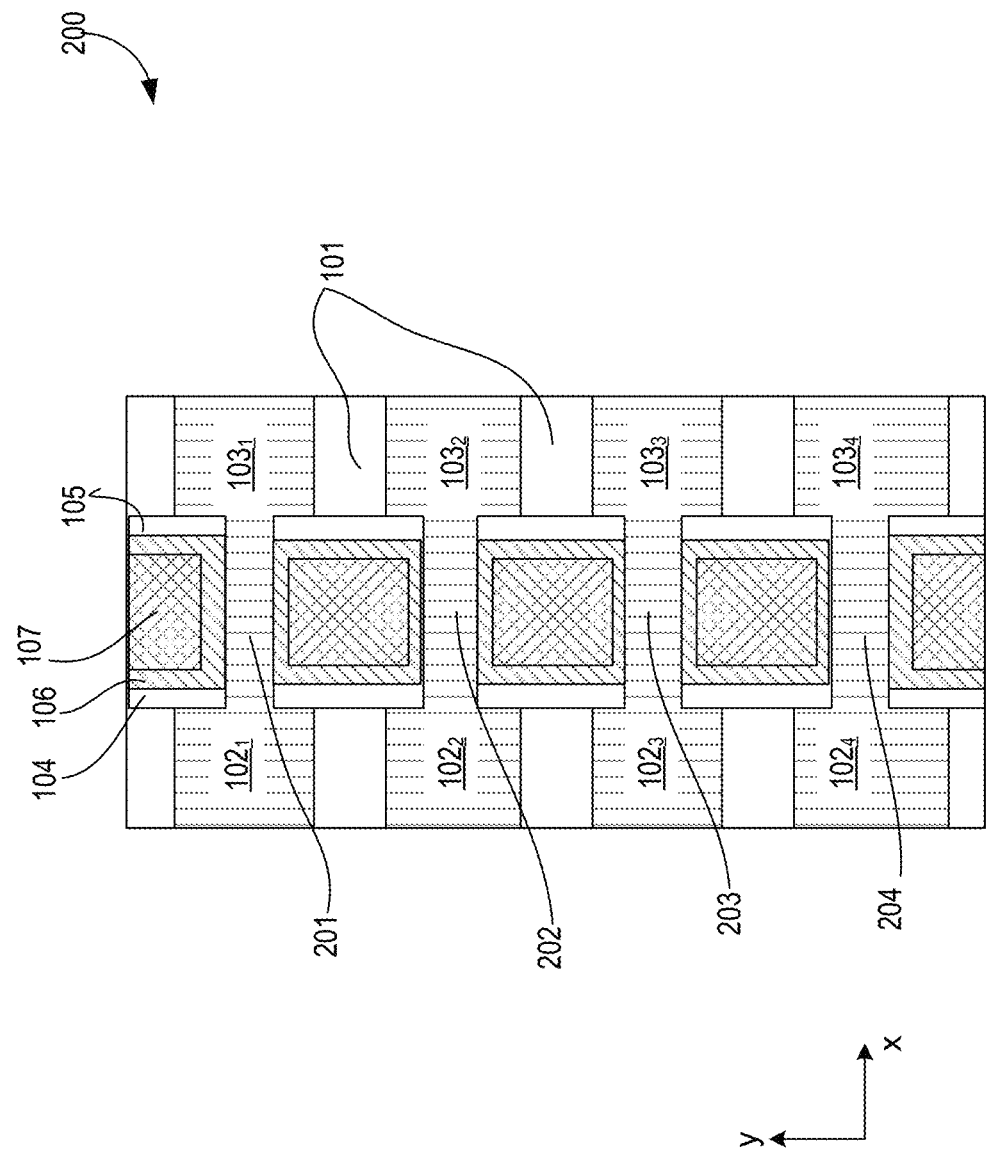
FIG. 2 illustrates a series of tri-gate transistors that collectively form a resonator, in accordance with some embodiments of the disclosure.

FIG. 2 illustrates an apparatus 200 comprises a series of tri-gate transistors that collectively form a resonator, in accordance with some embodiments of the disclosure. While apparatus 200 includes three transistors there is no maximum or minimum number of transistors for various embodiments of the invention). Specifically, FIG. 2 shows a cross-sectional view of a multi-fin structure on the x-y plane with z at the fin center. FIG. 2 includes a tri-gate transistor with a source node 102 coupled to a channel 201 of a fin, which then couples to a corresponding drain node 103. Channel 201 couples to FE gate dielectric 106 and gate 107. Other transistors include source nodes $102_{2\text{-}}$, channels 202, 203, 204, (all of which couple to gate 107 via separate gate dielectric portions 106), and drain nodes $103_{2\text{-}4}$.

Figure 3:
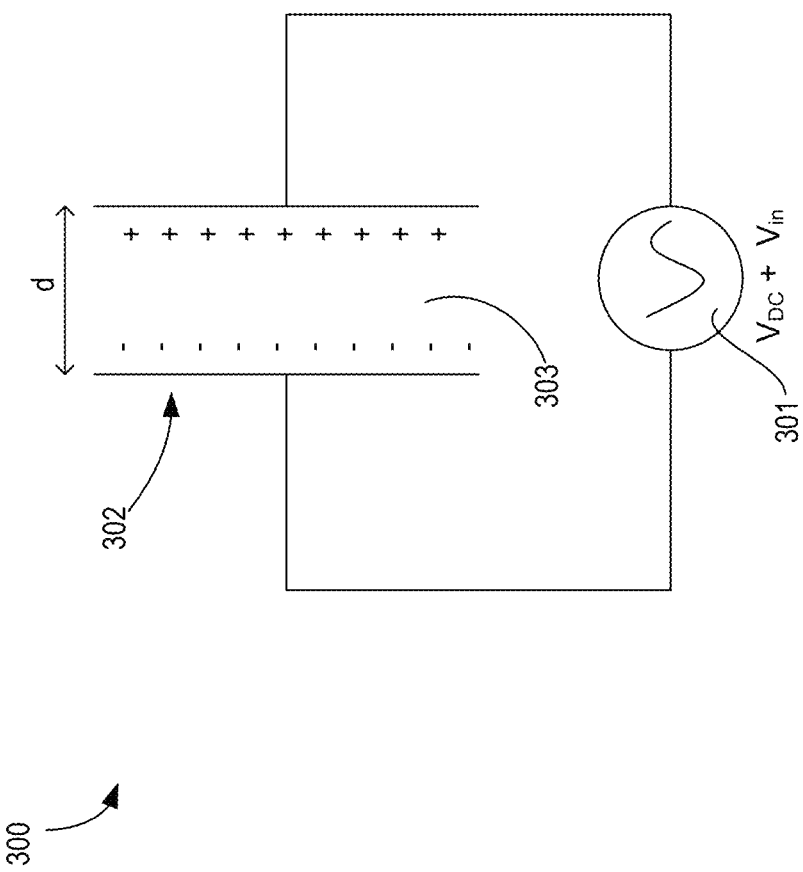
FIG. 3 illustrates a parallel plate capacitor model for modeling resonator actuation, in accordance with some embodiments.

FIG. 3 illustrates a parallel plate capacitor model 300 for modeling resonator actuation, in accordance with some embodiments. Here, the DC and AC bias are provided by source 301 to capacitor 302 resulting in actuation 303. The driving and sensing schemes for FE material modeled by the FE capacitor 302 include:

$$F_{ac} = \frac{\epsilon A}{d^2} V_{DC} v_{in}$$

where d, $\epsilon$, A, $V_{Dc}$, and $v_{in}$ respectively, correspond to gap thickness, permittivity, capacitor area, DC bias, and AC bias and result in actuation 303 due to actuation force $F_{ac}$.

Figure 4:
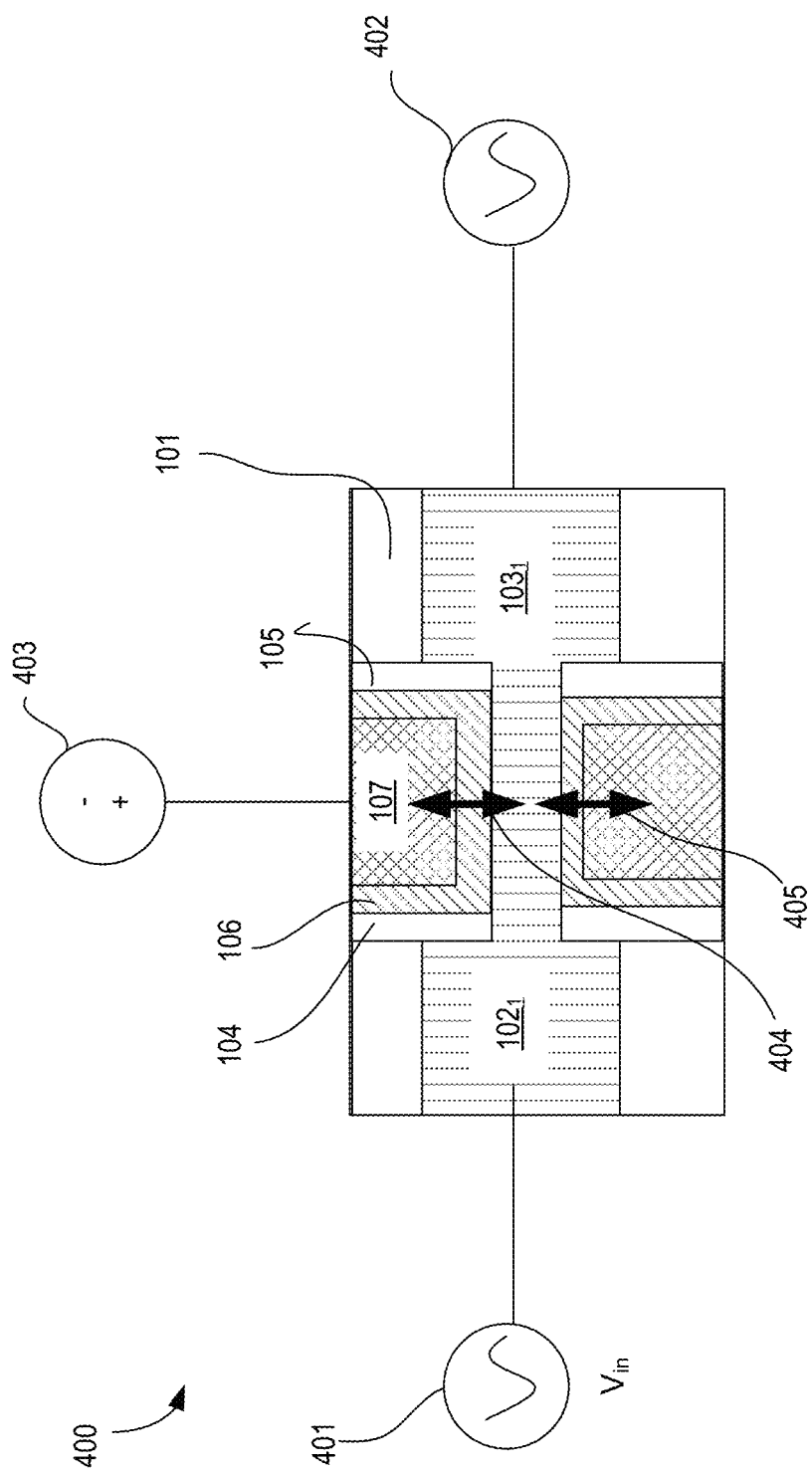
FIG. 4 illustrates capacitive actuation, in accordance with some embodiments.

FIG. 4 illustrates a cross-section 400 of a single fin transistor of FIG. 2 and its capacitive actuation, in accordance with some embodiments. Here, the source $102_1$ is biased by source 401 providing AC input voltage $v_{in}$, the drain $103_1$ is biased by source 402 providing AC input voltage $v_{in}$, and the gate 107 is biased by source 403 providing $V_{DD}$. As such, capacitive actuation 404 and 405 is induced across gate dielectric 106. The FE dielectric 106 helps provide a larger $F_{ac}$ for the same bias inputs. The $V_{DD}$ DC input is used to create capacitance across the fin and FE dielectric 106.

Figure 5:
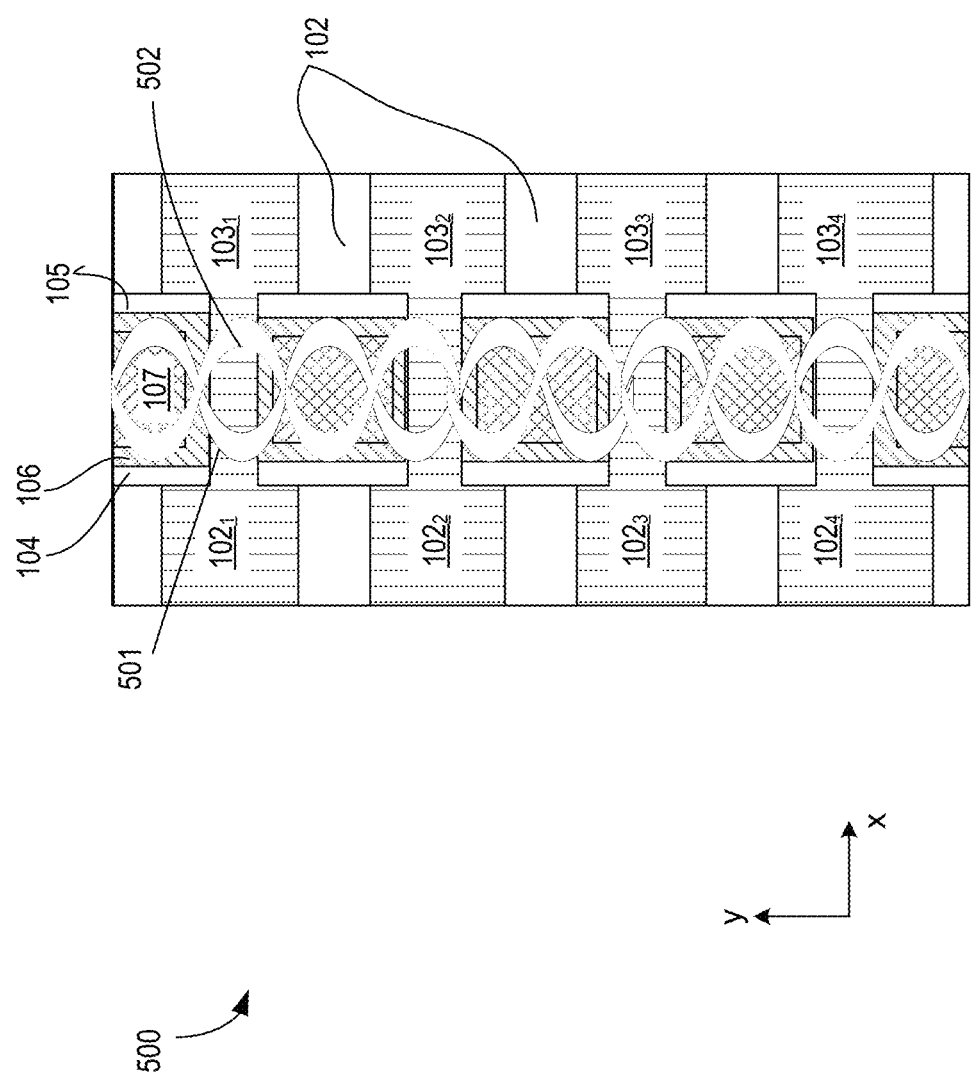
FIG. 5 illustrates a mechanical resonance within a gate of a multiple tri-gate resonator, in accordance with some embodiments.

FIG. 5 illustrates apparatus 500 comprises a series of tri-gate transistors that collectively form a resonator showing mechanical resonance within the gate 107 of the multiple tri-gate resonator, in accordance with some embodiments. Apparatus 500 is same as apparatus 200 but for the illustration of the mechanical resonance within the gate 107. As a result of the actuation described with reference to FIGS. 34, mechanical resonance is achieved within the gate 105. Here, line 501 corresponds to longitudinal displacement of gate 107 and line 502 corresponds to dynamic stress within gate 107. As AC input voltage $v_{in}$ on gate changes polarization of FE material 106, the FE material experiences strain which causes it to expand or contract depending on the operating point of the FE material in the hysteresis plot 150.

FIG. 6 illustrates sensing apparatus 600 in a resonator, in accordance with some embodiments. To sense periodic stress 502 (e.g., 301), gate 107 is biased with $V_{DD}$ by source 403 to help provide capacitance and generate an inversion layer for the channels that couple sources/drains $102_{1\text{-}2}$ to one another, and a DC bias is applied to drain $102_2$ by source 402 to flow MOSFET current 503 through a fin. For sensing, the source $102_1$ is coupled to ground GND1. When gate 107 resonates by expansion and contraction due to piezoelectric plus capacitive actuation across the ferroelectric gate dielectric 106, DC current 503 is modulated by the dynamic tensile/compressive stress 502 within the fin. Having polarization increases the strength of the capacitive actuation and due to inherent piezoelectric nature of the ferroelectric material, strain is realized. Here, the strain wave amplitude is higher due to higher capacitance from increased polarization of FE in the gate dielectric 106. Additionally all FE materials have inherent piezoelectric properties and that additional piezoelectric actuation of the gate capacitor can be used to drive a stronger strain wave, in accordance with some embodiments.

Figure 7A:
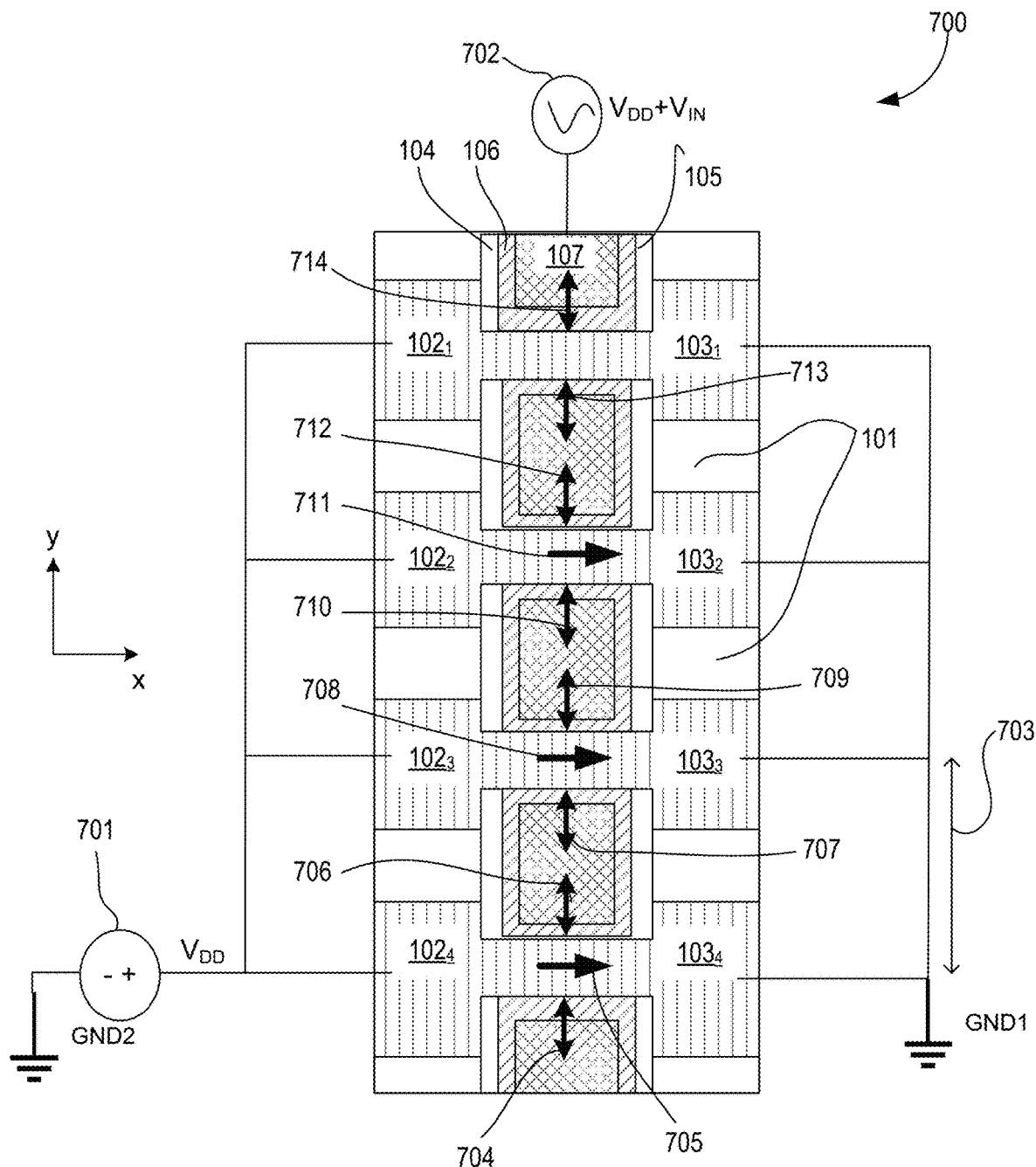
FIG. 7A illustrates a one dimensional (1D) model of a resonator where the fins are assumed to be tall and actuated when supply $V_{DD}$ is supplied to the source and drain components during gate dielectric actuation, in accordance with some embodiments.

FIG. 7A illustrates a one dimensional (1D) model 700 of a resonator where the fins are assumed to be tall and actuated when supply $V_{DD}$ is supplied to the source and drain components during gate dielectric actuation, in accordance with some embodiments. FIG. 7A is similar to FIG. 2 but showing the biasing scheme and actuation. Here, the term being tall generally refers to a height of a fin divided by its width to be greater than 3.0. It includes ratios such as 3.5, 4.0, 4.5, 5.0, 5.5, 6.0 and the like in various embodiments.

For actuation, $V_{DD}$ is supplied by source 701 to the source regions $102_{1-4}$ during gate actuation. The drain regions $103_{1-4}$ in this example are coupled to ground (GND1). For actuation, the gate 105 is coupled to source 702 and supplied $v_{in}$ AC to gate 107, along with $V_{DD}$. Here, $V_{DD}$ generates an inversion layer for the channel and also provides capacitance about the gate dielectric. In this example, fin-to-fin pitch is indicated by 703. While the embodiment here illustrates $V_{DD}$ is supplied by source 701 to the source regions $102_{1-4}$ during gate actuation 704, 706, 707, 709, 710, 712, 713, 714, in other embodiments $V_{DD}$ may be supplied to drain regions $103_{1-4}$. Note, when drain regions are supplied $V_{DD}$, source regions are tied to ground during gate actuation. The $v_{in}$ AC to gate 107 (e.g., 10 to 100 mV) and $V_{DD}$ (e.g., 0.7 to 1.2 V, depending on gate oxide thickness) excites the mechanical modes of the device. For example, the applied time varying voltage (DC+AC) on the gate 107 produces a time varying force on the channel material, which leads to acoustic resonance of the gate 107, putting an AC strain on the channel section/fin.

For sensing, $V_{DD}$ (e.g., 0.7 to 1.2V) is supplied to the source/drain regions and $V_{DD}$ (e.g., 0.7 to 1.2 V) is supplied to gate 107 to again generate an inversion layer for the channel and also provide channel inversion capacitance about the gate dielectric. The currents 705, 708, 711 can then be sensed that represent the piezo-resistive signal.

Figure 7B:
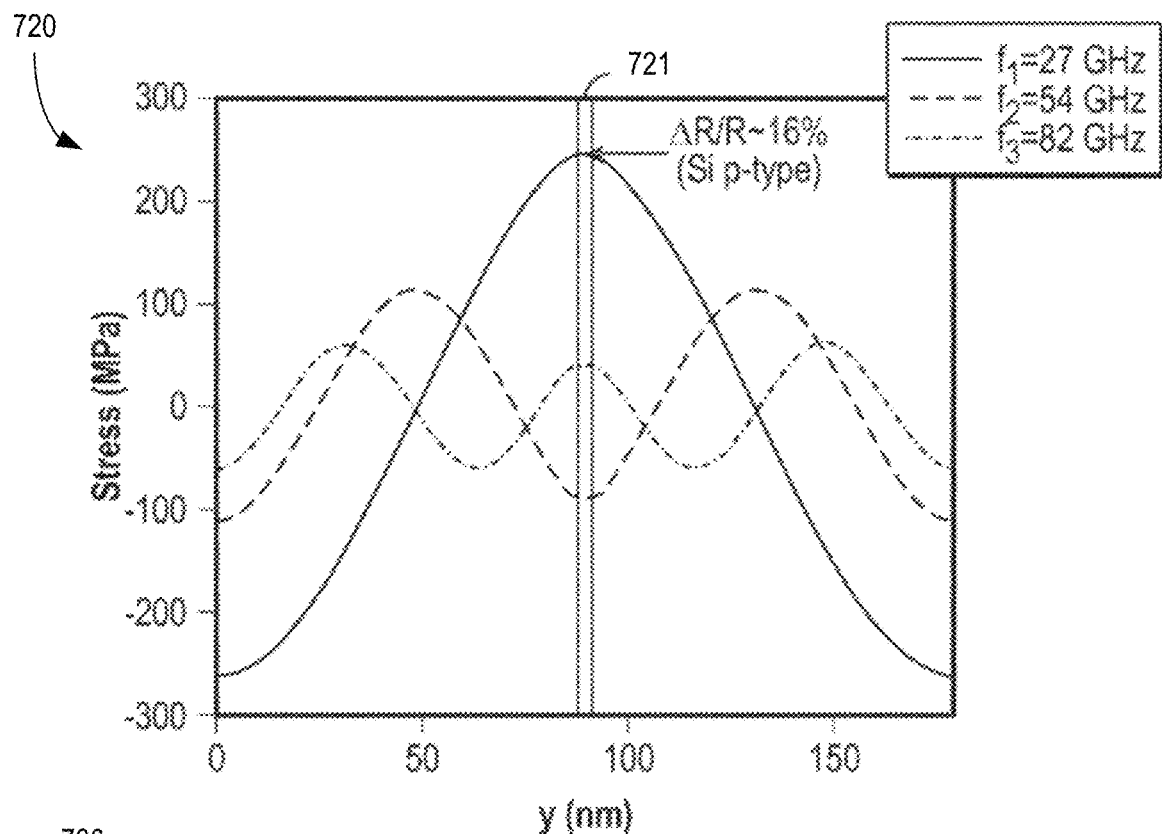
FIG. 7B illustrates a plot showing actuation induced stress distribution in the gate of the transistor.

FIG. 7B illustrates plot 720 showing actuation induced stress distribution in the gate of the transistor. The results are for first, second, and third modes (i.e., a fundamental "first mode" frequency for the first mode along with second and third harmonic frequencies of the fundamental frequency for the second and third modes) of the resonator device of FIG. 7A, where the fin to fin pitch is 180 nm (measured as the distance between two adjacent fin channels) 703, the fins are silicon fins, and gate 107 is a tungsten gate (but other embodiments are not so limited). The f-Q product is $2 \times 10^{13}$ Hz with f and Q being the frequency and quality factor for the resonator device, respectively. In FIG. 7B, the stress is maximized at the fin (one of which is designated with the vertical bar 721 at about 90 nm on the y axis) resulting in a maximum piezo-resistive signal detected by current 705 (or currents 708, 711).

In other words, for the fundamental frequency $f_1$=27 GHz the maximum stress of about 250 MPa is present at the fin, such as the fin described by $102_4$ and $103_4$ or any other fin along the gate of the resonator. The second mode ($f_2$=54 GHz—the second harmonic of f1) has a maximum stress of about 100 MPa and the third mode ($f_3$=82 GHz—the third harmonic of f1) has a maximum stress of about 75 MPa.

Figure 7C:
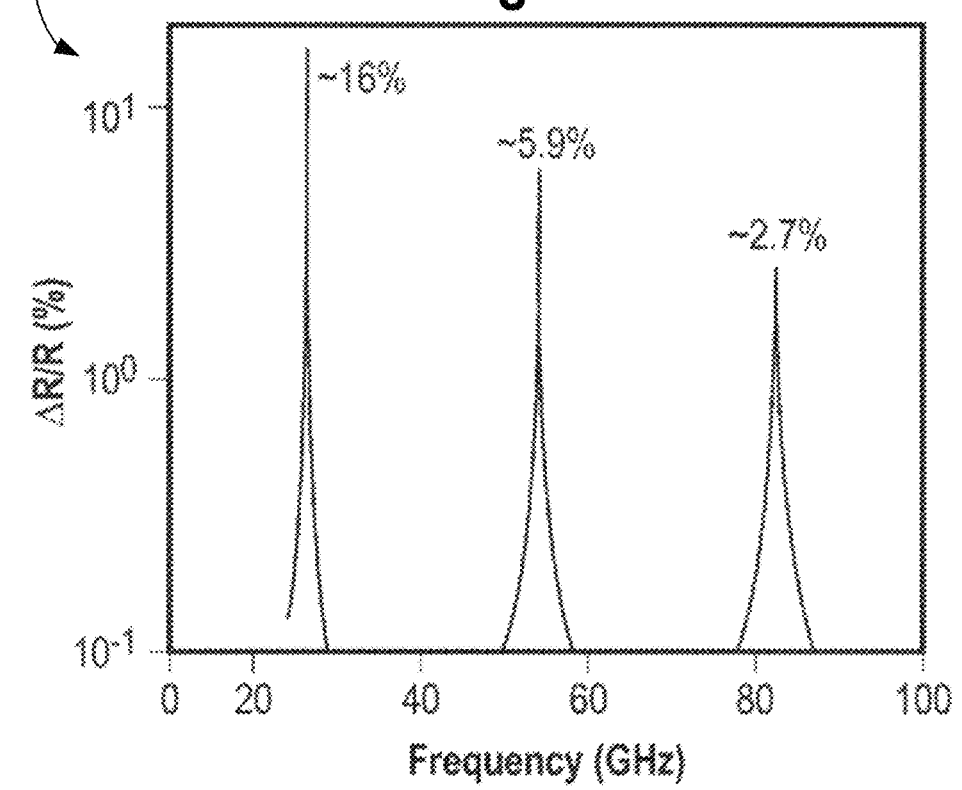
FIG. 7C illustrates a plot showing a relative change of resistance in three modes of operation, in accordance with some embodiments.

FIG. 7C illustrates plot 730 showing a relative change of resistance in three modes of operation, in accordance with some embodiments. In FIG. 7C, for silicon p-type parameters, the relative change of resistance $\Delta R/R$ for the first mode is about 16%, which is significantly larger than those of RBTs with similar f-Q product values (which allows for easier detection of the resonant frequency). The $\Delta R/R$ for the second mode is about 5.9% and the $\Delta R/R$ for the third mode is about 2.7%.

Figure 8A:
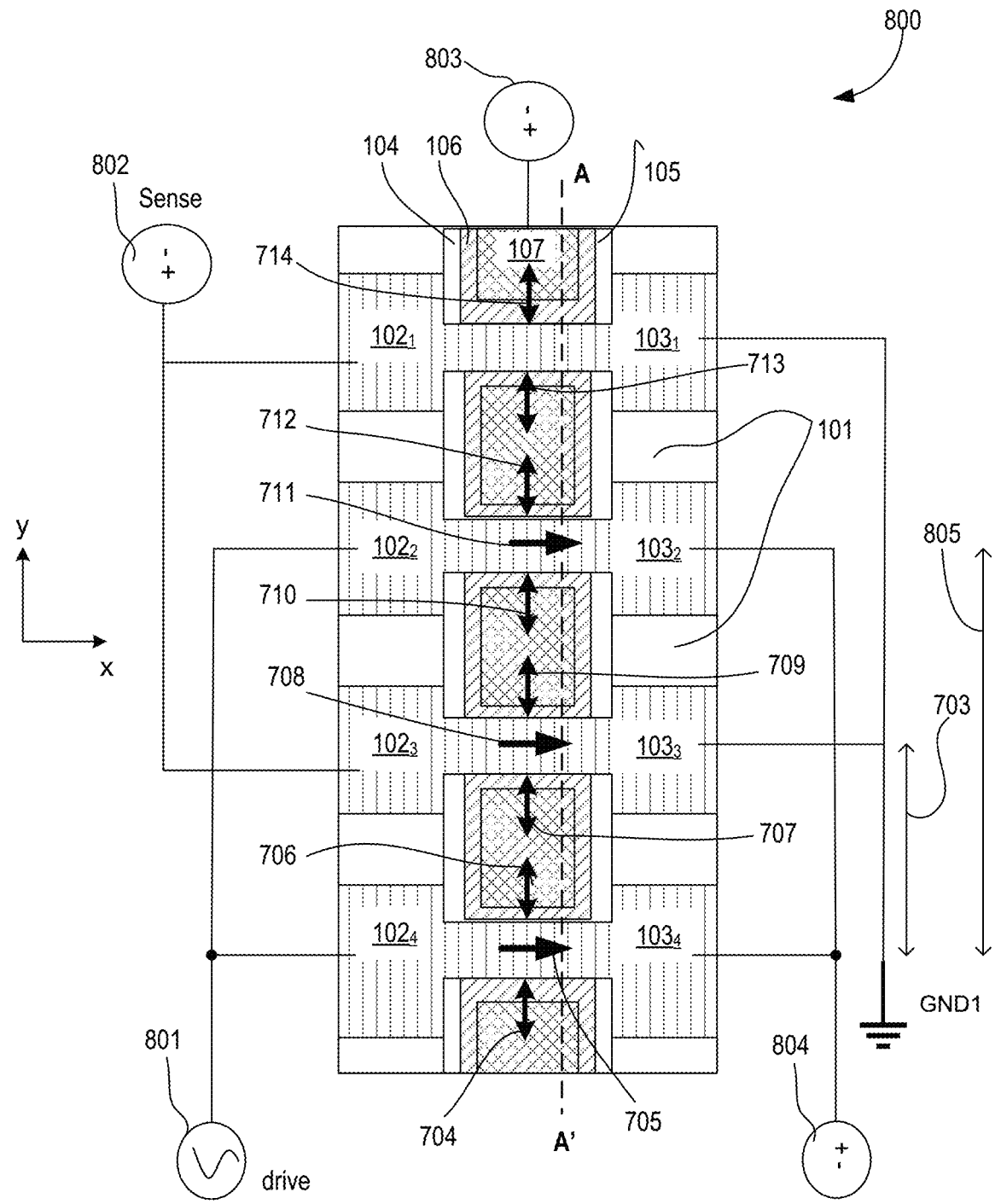
FIG. 8A illustrates a biasing scheme where FE dielectric actuation is skipped at every other fin while one half of the fines are used for sensing, in accordance with some embodiments.

FIG. 8A illustrates a biasing scheme 800 where dielectric actuation is skipped at every other fin while one half of the fines are used for sensing, in accordance with some embodiments.

In the first case, as also discussed with regard to FIG. 7A, all the fins are actuated when $V_{DD}$ is supplied to the source/drain regions during gate dielectric actuation 704, 706, 707, 709, 710, 712, 713, 714. Also, to generate the gate actuation $v_{in}$ AC is supplied to gate 107, along with $V_{DD}$. For sensing, current 705, 708, 711 from source 701 is supplied to the source regions $102_{1-4}$ and 0 V to the drain region $103_{1-4}$. $V_{DD}$ and $v_{in}$ AC is supplied to gate 107. In this embodiment of FIG. 7A, each of the fins is used for both driving and sensing. The PZR device pitch (e.g., distance between fins that are actively driven with current during actuation, the distance being measured "mid fin" to "mid fin") 703 determines the resonant frequencies.

In the second case, as discussed with reference to FIG. 8A the dielectric actuation is skipped at every other fin (e.g., half of the fins are used for actuation while the other half of fins are used for sensing). In this example, source regions $102_2$ and $102_4$ are used for driving using source 801, source regions $102_1$ and $102_3$ are used for sensing using source 802. Gate 107 is biased by source 803 (like source 702). Here, drain regions $103_2$ and $103_4$ are also biased by source 804. In some embodiments, source 804 is a DC bias voltage to ensure operation at the correct bias condition. In an alternate embodiment, sources 801 and 804 have alternating drivers. For example, the driving signal by source 801 is out of phase relative to the phase of the driving signal by source 805 as shown resonator 860 by FIG. 8F. In this example, source region 1022 is coupled to driver 805 while source region 1024 is coupled to driver 801, where driver 805 is out of phase by θ degrees. As such, with reference to FIG. 12, the drive MOSCAPs 1201 and 1203 will have opposite polarity of the drive voltage by source 801.

Referring back to FIG. 8A, the alternating of fins for dielectric actuation doubles the PZR device pitch 703 to twice that of the fin pitch 805. Thus, while fin pitch may only be 180 nm the "PZR device pitch" is twice that amount at 360 nm, which scales the resonant frequencies by a factor of ½. Thus, $f_1$ for the first operation mode (with reference to FIG. 7A) is 27 GHz but due to the PZR device pitch change the fundamental $f_1$ frequency for the second operation mode of FIG. 8A is 13 GHz (i.e., half of 27 GHz). The approach can be extended to achieve scaling factors of ⅓, ¼, and the like. Another advantage of the second operation mode (of FIG. 8A) is that since drive and sense fins are separated, there is reduced feed-through current to the sense fins, which improves signal to noise ratio for the PZR.

Figure 8B:
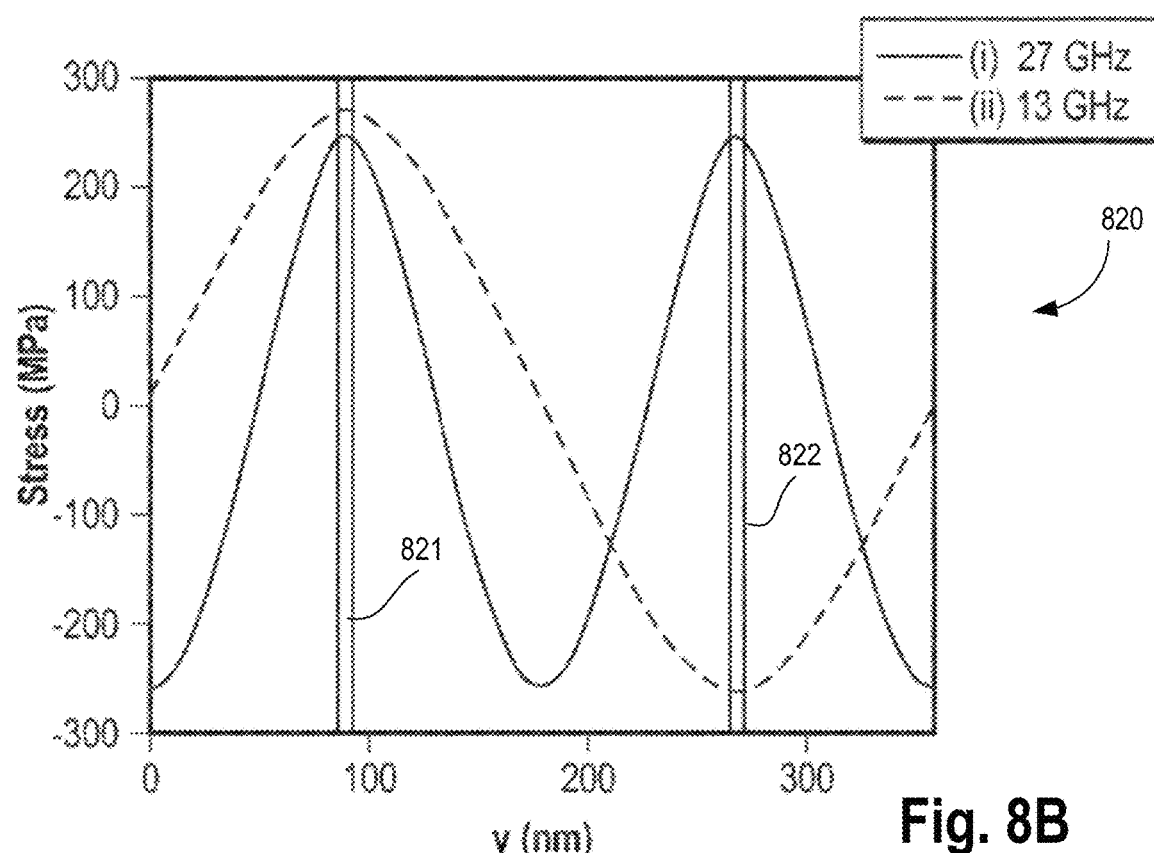
FIG. 8B illustrates a plot showing stress distribution and frequency sweeps for schemes of FIG. 7A and FIG. 8A, in accordance with some embodiments.

FIG. 8B illustrates plot 820 showing stress distribution and frequency sweeps for schemes of FIG. 7A and FIG. 8A, in accordance with some embodiments. By doubling the length of the period (i.e., the second operation mode (ii) as described by FIG. 8A), resonant modes are obtained that are not available for the single period case. For plot 800, again a maximum stress is at the fin located at about 90 nm on the y-axis for the first operation mode (i) discussed with reference to FIG. 7A. However for the second operation mode (ii), as described by FIG. 8A, the maximum stress shifts locations in correspondence to its lower frequency. In other words, in an embodiment, the maximum stress for the second operation mode (ii) is located at each of the fins except the maximum stress alternates plus (first vertical bar 821 at about 90 nm) to minus (other vertical bar 822) maximum stress. The maximum positive stress occurs at the driven fins. More specifically, the maximum stress basically means maximum "magnitude" of stress when dealing with dynamic stress. For the two vertical bars in plot 800 (that correspond to fins with the left bar/sense/right bar assumed to respectively be the drive fin/sense fin for the double pitch case (dashed curve)), both fins experience the maximum stress but each with opposite phase (drive fin has positive maximum stress and sense fin has negative maximum stress). At some other time point, the phase may be reversed and the drive fin may experience the negative maximum stress with the sense fin experiencing the positive maximum stress.

Figure 8C:
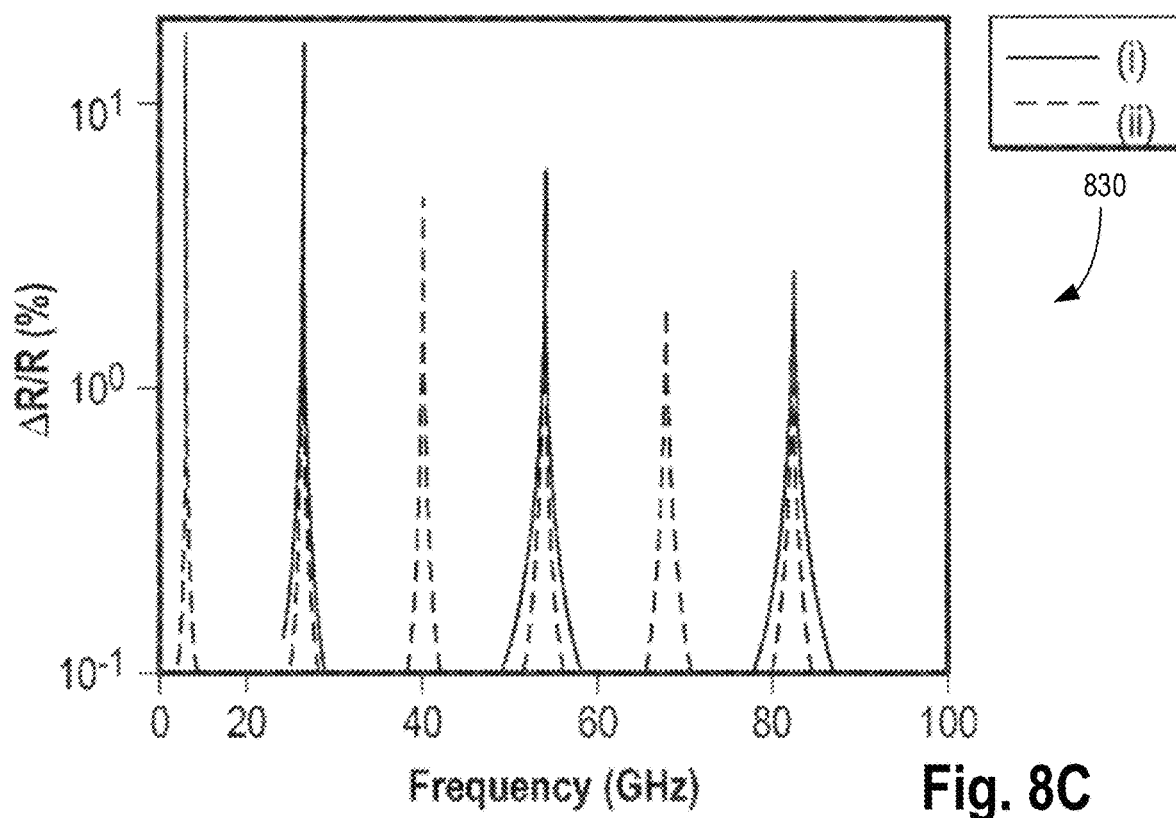
FIG. 8C illustrates a plot showing twice the change of resistance peaks as compared to the higher frequency associated with operation mode of FIG. 7A, in accordance with some embodiments.

FIG. 8C illustrates plot 830 showing twice the change of resistance peaks as compared to the higher frequency associated with operation mode of FIG. 7A, in accordance with some embodiments. Plot 830 shows twice the ΔR/R peaks as compared to the higher frequency associated with the first operation mode (i). This occurs because the frequency axis is the same but the resonance occurs at a lower frequency. Therefore, there are more peaks over the same x-axis range of frequency.

Figure 8D:
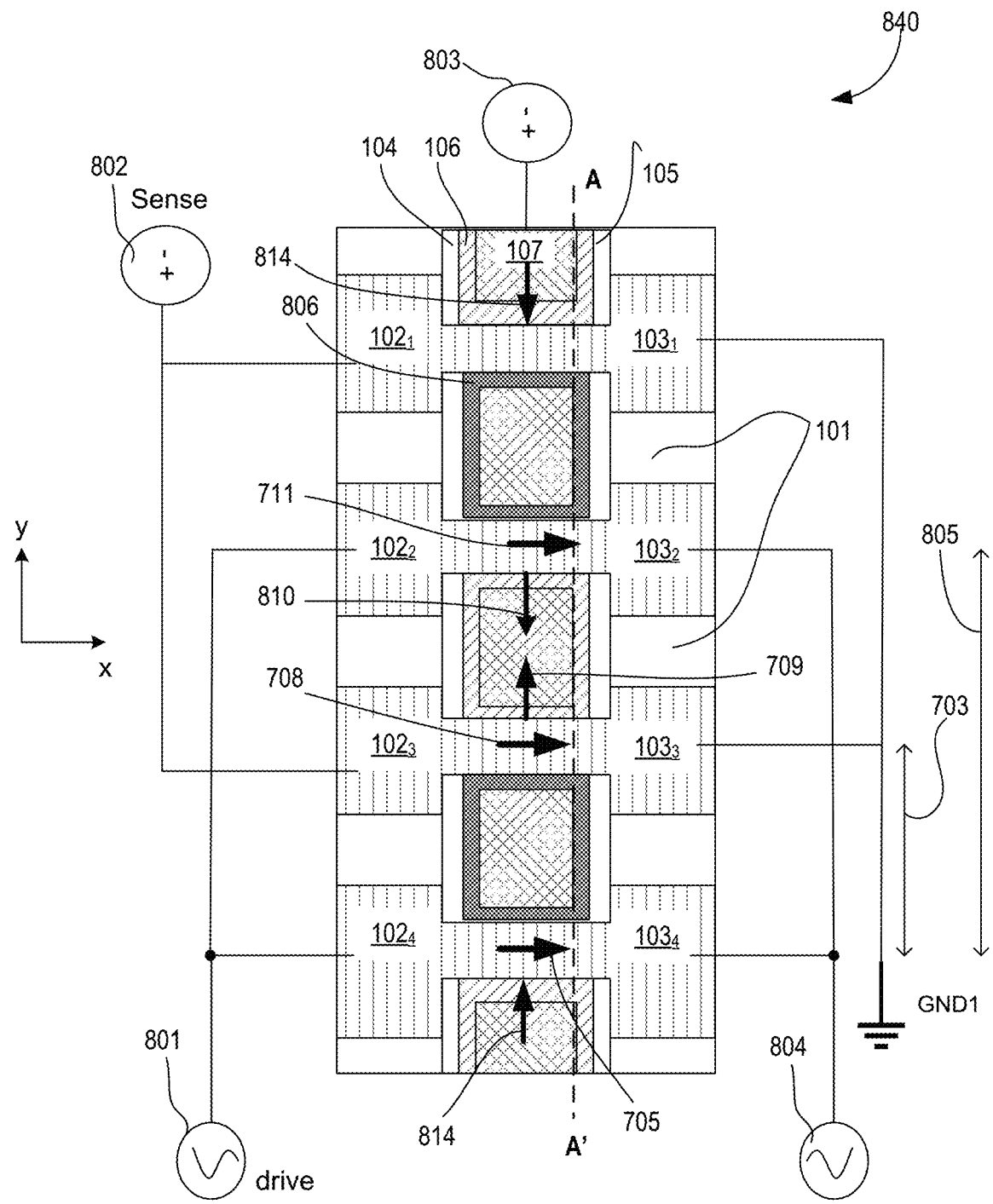
FIG. 8D illustrates a biasing scheme where FE dielectric actuation is skipped at every other fin while one half of the fines with typical dielectric are used for sensing, in accordance with some embodiments.

FIG. 8D illustrates biasing scheme 840 where FE dielectric actuation is skipped at every other fin while one half of the fines with typical dielectric are used for sensing, in accordance with some embodiments. Resonator of FIG. 8D is similar to resonator of FIG. 8A except that the gates coupled to the sensing circuit (e.g., sensing source 802 and GND 1) have regular gate dielectric instead of ferroelectric dielectric. For example, alternating gates have gate dielectric 806 instead of ferroelectric 106. In this example, transistor gates that are not used for actuating the ferroelectric to generate resonating signals can have regular gate dielectric.

The gate dielectric may be formed from any well-known gate dielectric material, including but not limited to silicon dioxide ($SiO_2$), silicon oxynitride ($SiO_xN_y$), silicon nitride ($Si_3N_4$), and high-k dielectric materials such as hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

Figure 8E:
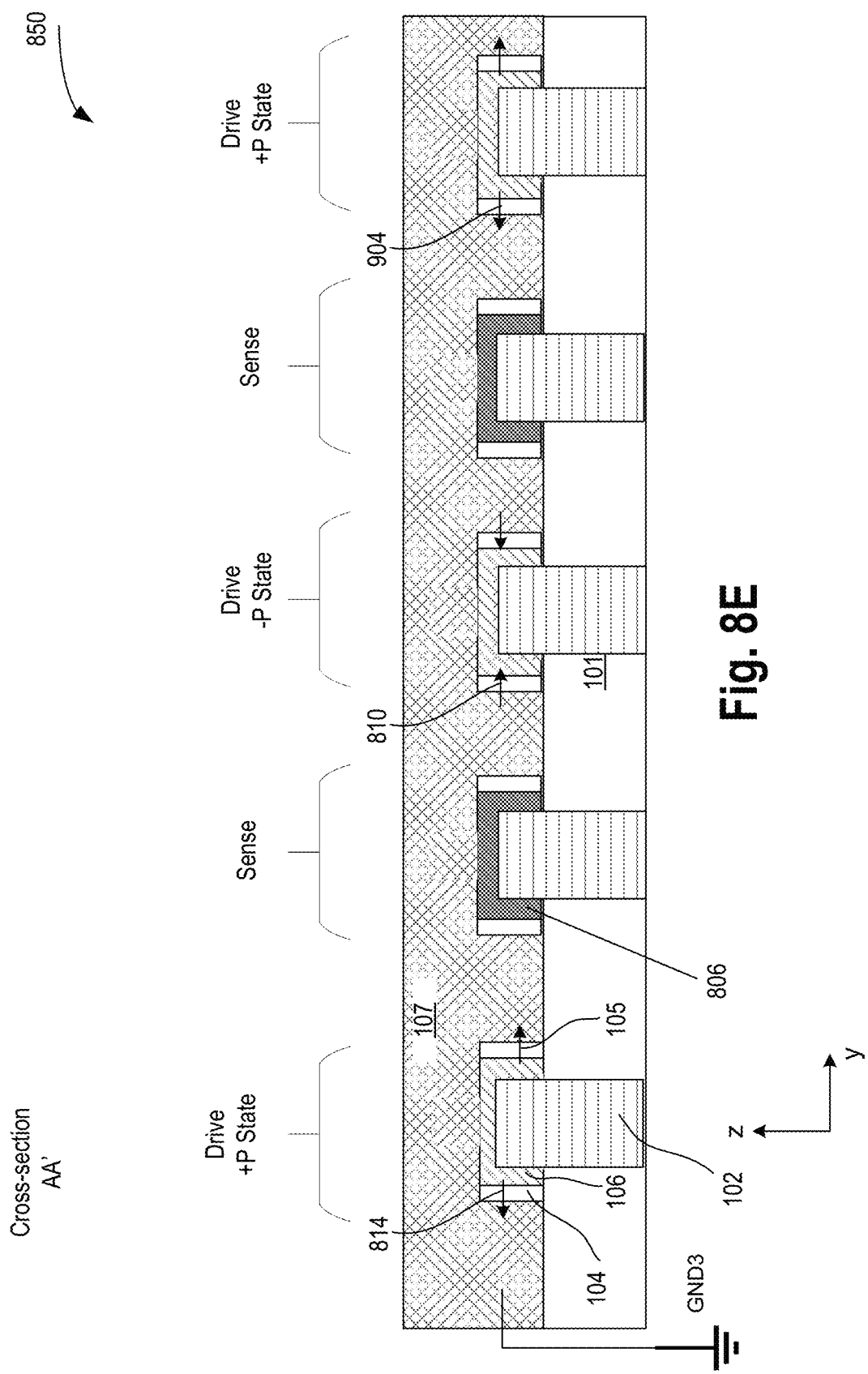
FIG. 8E illustrates a cross-section of the resonator of FIG. 8D along the length of the gate, in accordance with some embodiments.
Figure 8F:
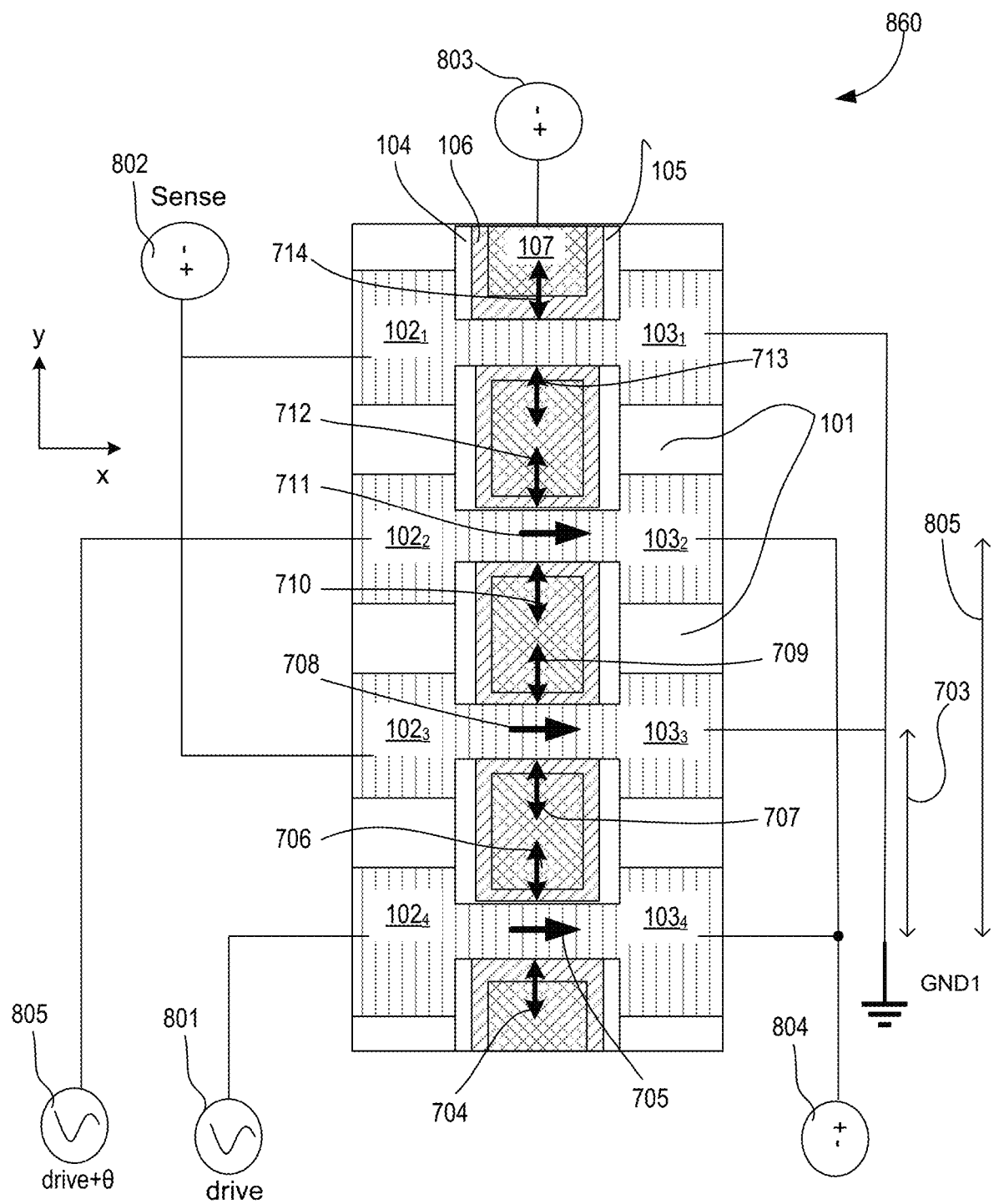
FIG. 8F illustrates another biasing scheme where FE dielectric actuation is skipped at every other fin while one half of the fines are used for sensing, in accordance with some embodiments.

FIG. 8E illustrates a cross-section 850 of the resonator of FIG. 8D along the length of the gate, in accordance with some embodiments. A pattern can be written on the fly to the drive capacitors having FE material 106. In various embodiments, the fin-section 102 under the FE gate is doped. This ensures that the FE oxide 106 can be poled in either direction with a + (plus) or − (negative) voltage on the trench contact (TCN). In this phase, the gate 107 is grounded. Since the oxide 806 under the sense transistors is a regular oxide (e.g., $HfO_2$ or $SiO_2$), it is not impacted during the poling phase.

The driving signal is applied to the poled capacitors comprising FE 106. Depending on the polarization direction defined during poling-phase, acoustic waves of different wavelengths are created. In this example, alternate fins are driven with positive or negative voltages resulting in alternative polarization of the respective FE material. For example, positive voltage applied to a fin results in positive polarization (+P State) in FE material 106 while negative voltage applied to a fin results in a negative polarization (−P state). The positive polarization results in expansion of the gate indicated by actuation 814 while negative polarization result in contraction of the gate indicated by actuation 810.

Note that drive and sense fins do not have to be alternate. Designs can use multiple drive capacitors before a sense transistors is used. For example, 2, 3, 4, 5, etc. drive capacitors of FE material 106 can be poled before the sense fin. The concept can be applied to two-dimensional (2D) array. In some embodiments, the one dimensional (1D) structure of FIG. 8E is repeated in orthogonal direction with individually addressable TCN contacts.

By changing the polarization orientation from one to another, the strain response changes from compressive to tensile. Such devices can be arrayed along the width of the fin or along the length of the gate to make a complex mode shape based resonator. By changing, the orientation using polling the frequency of the resonator can be re-written to make it programmable.

Figure 9A:
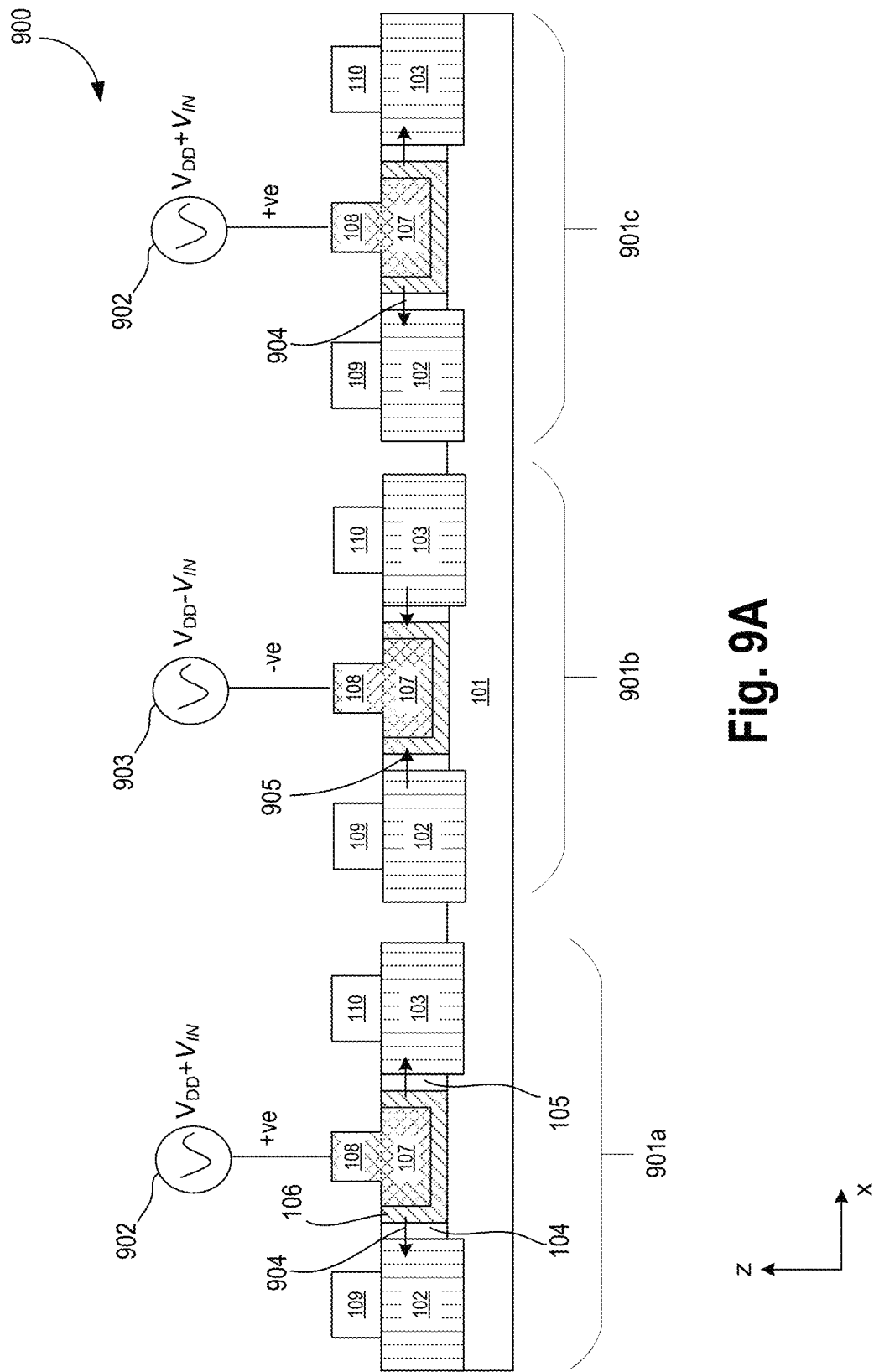
FIG. 9A illustrates a cross-section of a FE based resonator along the width of the gate, in accordance with some embodiments.

FIG. 9A illustrates cross-section 900 of a FE based resonator along the width of the gate, in accordance with some embodiments. Here, the gate of transistor 901a is biased by a positive voltage 902 to positively polarize the FE material 106 of transistor 901a, the gate of transistor 901b is biased by a negative voltage 903 to negatively polarize the FE material 106 of transistor 901b, and the gate of transistor 901c is biased by a positively voltage 902 to negatively polarize the FE material 106 of transistor 901c, and so on. As such, every other alternating transistor gate is positively biased while transistor gates between the every other alternating transistor gate is biased by a negative bias. The bias conditions can then flipped be flipped at a certain time to change the orientation of polarization of the respective FE layers of the gates. As such, acoustic wave is generated by the compression and relaxation of the gates as indicated by arrows 904 and 905. The mechanical actuation due to biasing of the FE material 106 may also cause change in current under the channel, and this change in current can be sensed to determine the frequency of the acoustic wave, in accordance with some embodiments.

Figure 9B:
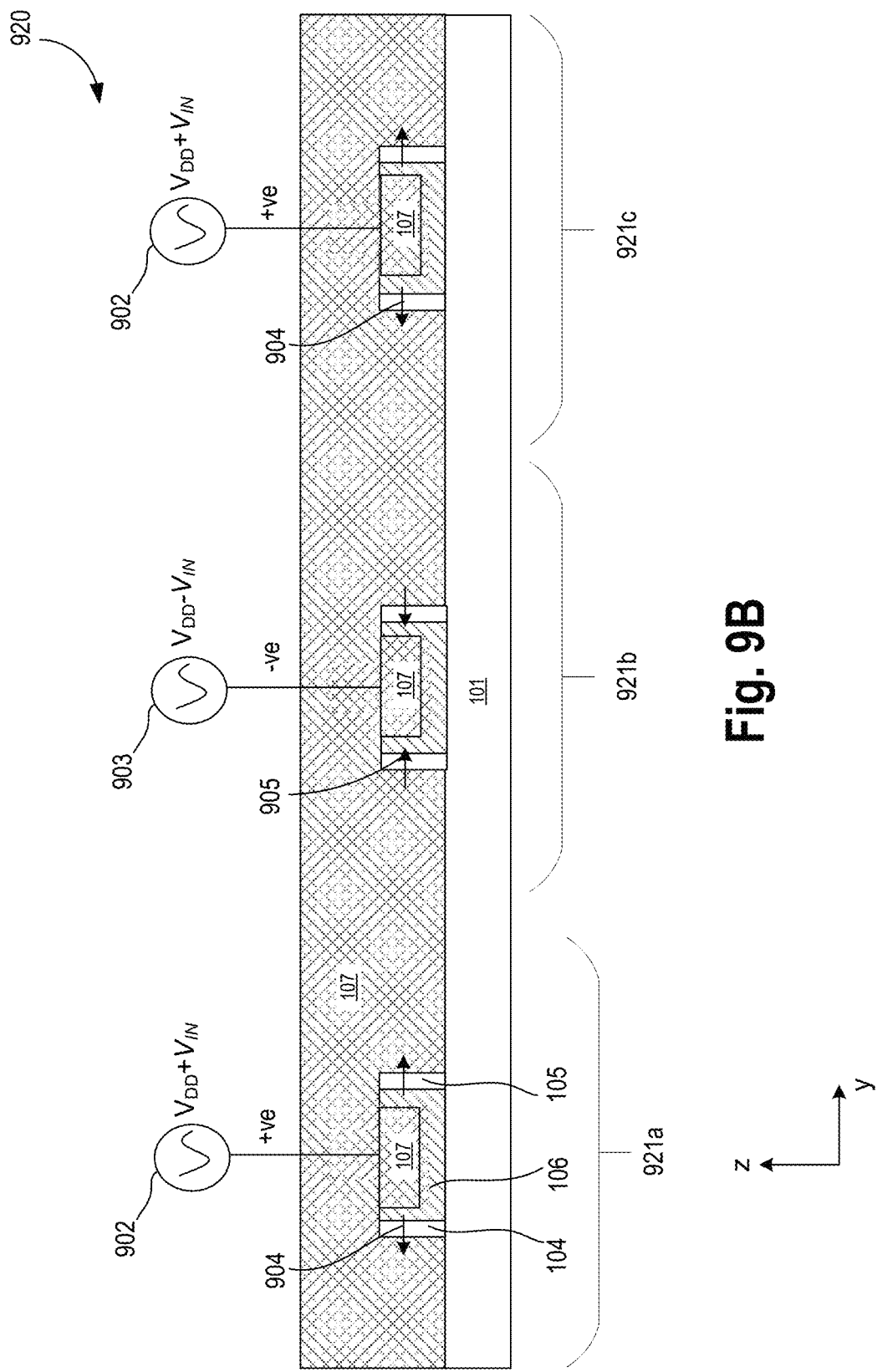
FIG. 9B illustrates a cross-section of a resonator along the length of a gate, in accordance with some embodiments.

FIG. 9B illustrates cross-section 920 of a resonator along the length of a gate, in accordance with some embodiments. Cross-section 920 is a cross-section along the length of the gate 107 while cross-section 930 is a cross-section along the width of the gate of the resonator having multiple transistors. Here, the gate of transistor 921a is biased by a positive voltage 902 to positively polarize FE material 106 of transistor 921a, the gate of transistor 921b is biased by a negative voltage 903 to negatively polarize the FE material 106 of transistor 921b, and the gate of transistor 921c is biased by a positively voltage 902 to negatively polarize the FE material 106 of transistor 921c, and so on. As such, every other alternating transistor gate is positively biased while transistor gates between the every other alternating transistor gate is biased by a negative bias. The bias conditions can then be flipped at a certain time to change the orientation of polarization of the respective FE layers of the gates. As such, acoustic wave is generated by the compression and relaxation of the gates as indicated by arrows 904 and 905. The mechanical actuation due to biasing of the FE material may also cause change in current under the channel, and this change in current can be sensed to determine the frequency of the acoustic wave, in accordance with some embodiments.

Figure 9C:
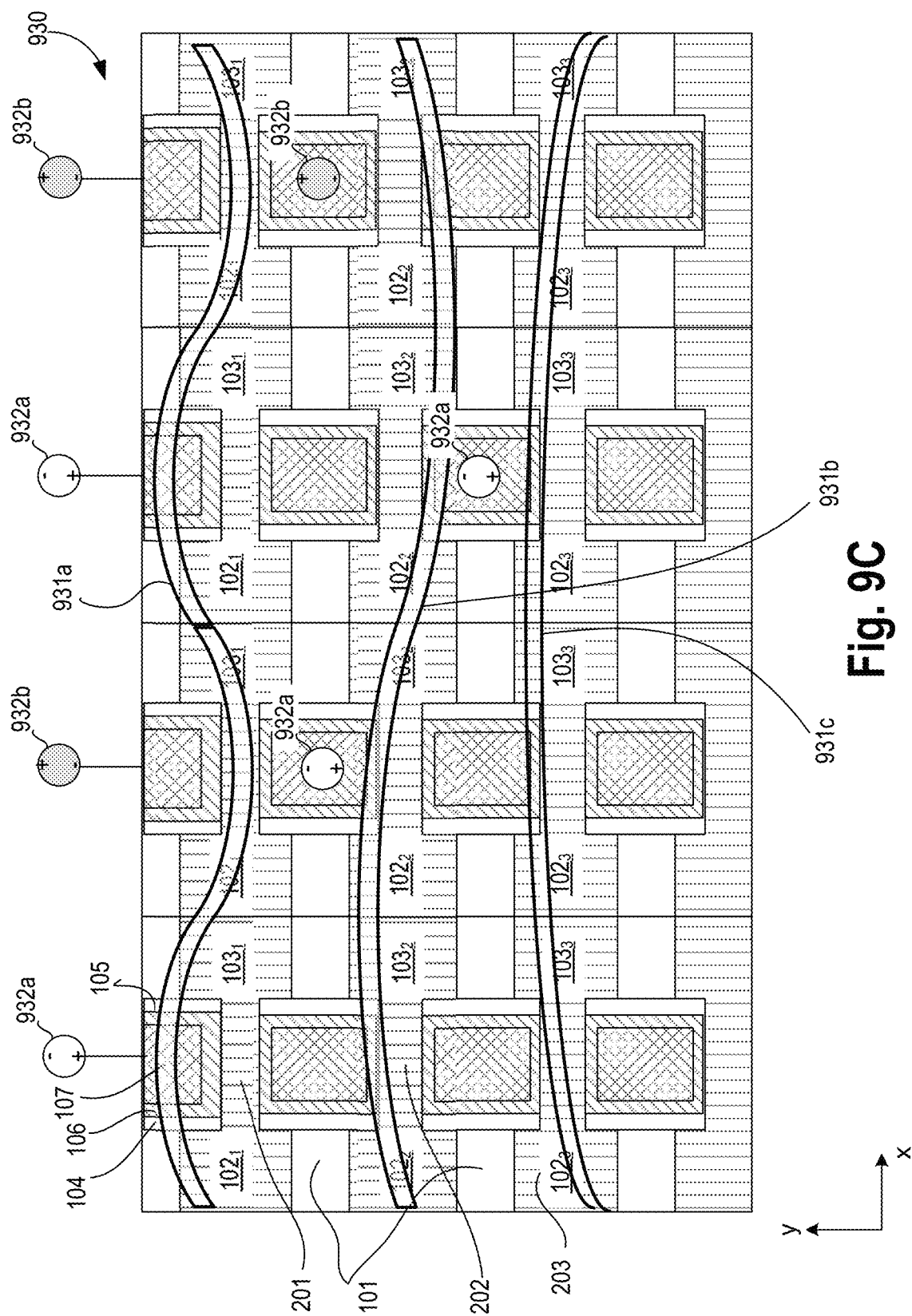
FIG. 9C illustrates a top view of multiple transistors where resonant frequencies of different wavelengths are generated by FE dielectric actuation along the length of the resonator, in accordance with some embodiments.

FIG. 9C illustrates top view 930 of multiple transistors where resonant frequencies of different wavelengths are generated by FE dielectric actuation along the length of the resonator, in accordance with some embodiments. Here, different wavelengths of acoustic signals are generated along the width of the transistors.

The acoustic signal 931a is generated by biasing alternate gates with opposite polarity voltages. For example, the gate to the left and on the top row is biased by 932a which at one time provides a positive voltage and thus positive polarization to the FE material 106 of that gate. In the same matter, the second gate from the left and on the top row is biased by 932b which at one time provides a negative voltage and thus negative polarization to the FE material 106 of that gate. Continuing with this example, the third gate from the left and on the top row is biased by 932a which at one time provides a positive voltage and thus positive polarization to the FE material 106 of that gate, and the fourth gate from the left and on the top row is biased by 932b which at one time provides a negative voltage and thus negative polarization to the FE material 106 of that gate. The alternating biasing of the gates in the first row from the top causes acoustic signal 931a to be produced with a first wavelength.

In the second row of transistor gates, every other gate is biased by an opposite bias. In this example, gates between the biased gates can be used for sensing or can remain unbiased. In some embodiments, the unbiased gates may have regular gate dielectric instead of FE material. Compared to waveform 931a, here the wavelength doubles for wave 931b. The third row of gates generates a wave 931c with wavelength which is double the wavelength of 931b using the same principle of basing the FE material of the gates every four gates.

In some embodiments, the same silicon that this generating 931a, different acoustic signals 931b and 931c of different wavelengths can also be generated. As such, a single die can have one or more acoustic signals with different wavelengths travelling from one point of the die to another point in the die. In some embodiments, the wavelength of each acoustic waveform can be adjusted by biasing different gate nodes while unbiasing other gate nodes.

Figure 10A:
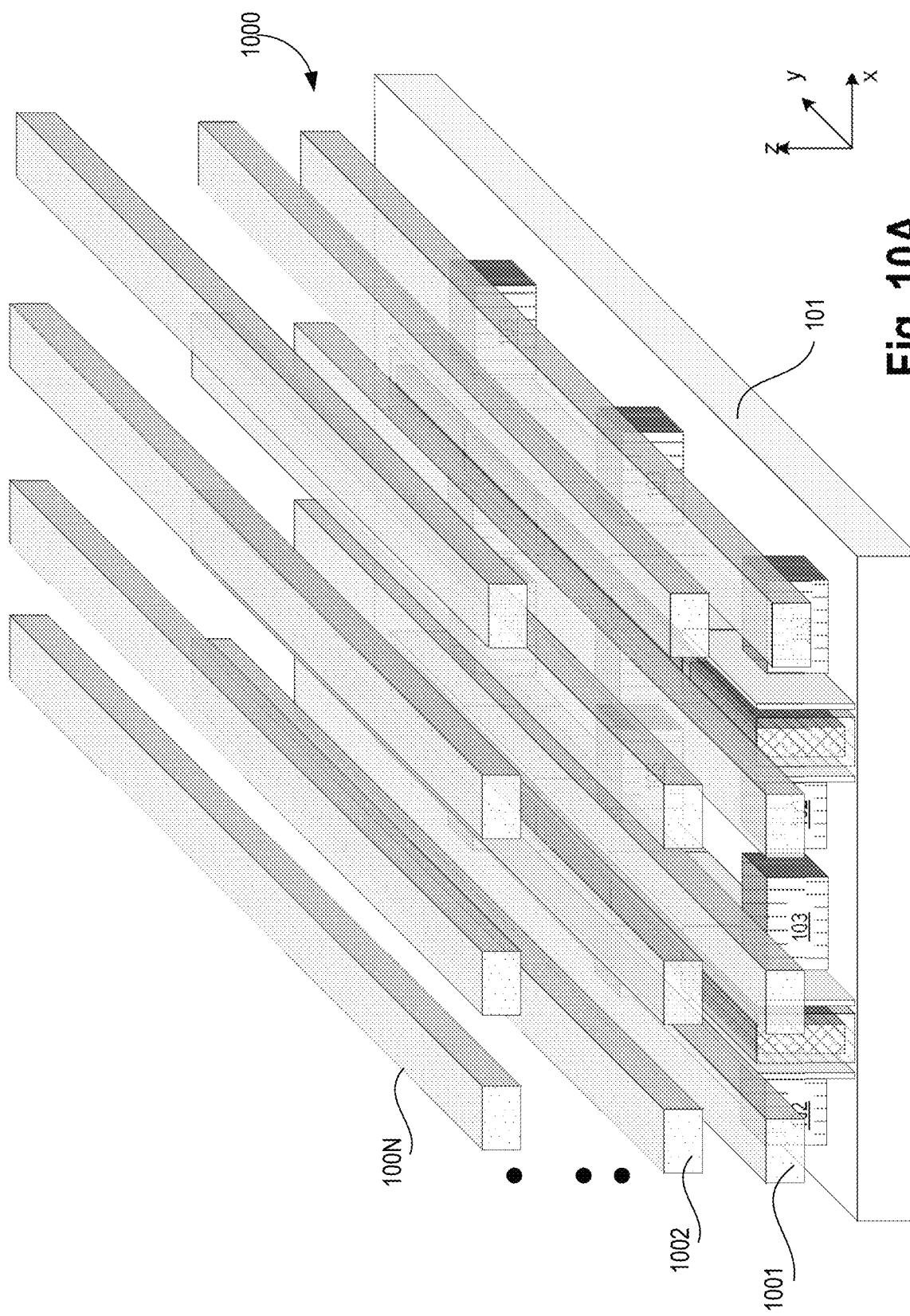
Figure 10B:
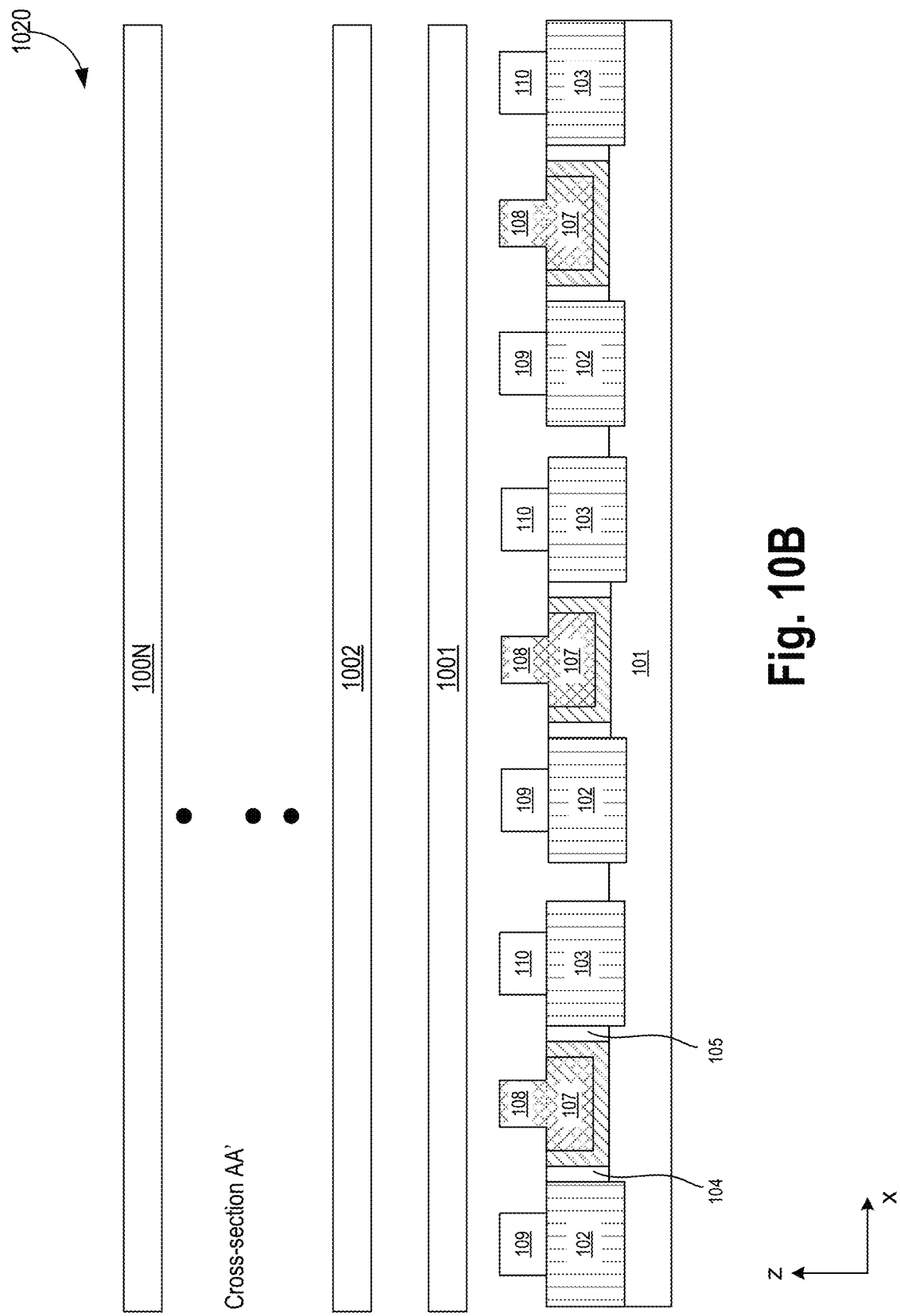
Figure 10C:
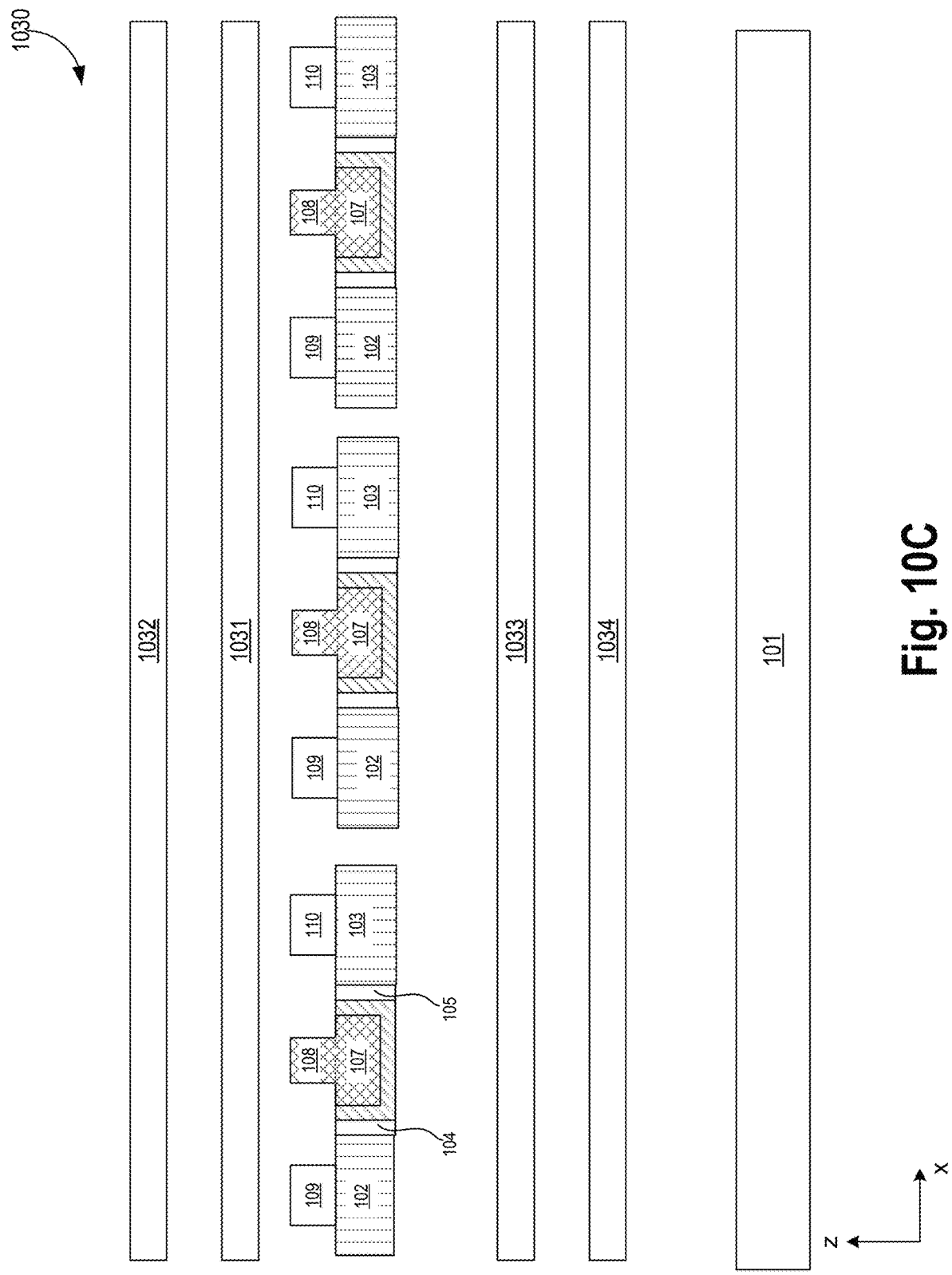

FIGS. 10A-C illustrate acoustic waveguide 1000, 1020, 1030, and 1040, respectively, with Bragg reflectors adjacent to a multi-gate transistor having FE material, in accordance with some embodiments. With the backdrop of FE based transistors discussed herein that are biased to operate as high efficiency resonators, phononic trans-conductance of the resonating signal can be achieved using Bragg reflectors, in accordance with some embodiments.

With reference to FIG. 10A, in some embodiments, metal interconnects are formed in parallel above the FE gate dielectric based transistors. These metal interconnects may not couple to one another and may be unbiased. For example, metal layer 1 1001 interconnects are fabricated parallel over FE gate dielectric based transistors forming an acoustic waveguide for resonating signals to traverse between the surface of the transistors and the metal layer 1 1001 interconnects. To further guard the propagation of resonating signals, additional metal layers 1002 through 100N (where 'N' is greater than 2) over interconnects 1001 may be fabricated. These interconnects 1001 through 100N may not couple with one another and may be unbiased. In some embodiments, interconnects 1001 through 100N are coupled to ground or a power supply.

While the embodiment of FIG. 10A illustrates metal interconnects traversing along the y-axis, they can also traverse along the x-axis. In some embodiments, metal layer 1001 runs orthogonal to metal layer 1002. For example, metal layer 1001 extents in the y-direction, while metal layer 1002 extends in the x-direction.

In some embodiments, metal or poly structures are along formed on either sides of the set of transistors of waveguide 1000. For example, poly or metal layer 0 structures along the y-direction may be formed over substrate 101. This allows to enclose the waveguides more to retain the trans-conductance of the resonating signal along the y-direction.

FIG. 10B illustrates cross-sectional view (cross-section AA) 1020 of FIG. 10A. As seen, the metal layers 1001 and 1002 are not directly coupled to one another using vias, and are used for providing the "walls" for the acoustic resonator. While two metal layers 1001 and 1002 are shown, additional or fewer metal layers may be used for trans-conducting resonating signals through the acoustic waveguide.

FIG. 10C illustrates cross-sectional view 1030 of another acoustic waveguide. Here, transistors with FE gate dielectric are formed in the backend of the die compared to the transistors shown in FIG. 10B, which are formed in the frontend of the die. In one such embodiments, metal layers can be encased around the transistors for form a fully metal encased acoustic waveguide within the die. In this example, two metal layers 1031 and 1032 are formed above the backend transistors with FE gate dielectric, and two metal layers 1033 and 1034 are formed below the backend transistors with FE gate dielectric. In some embodiments, additional or fewer metal layers may be used for trans-conducting resonating signals through the acoustic waveguide. In some embodiments, metal layers may also be fabricated along the sides of the backend transistors such that they are fully encased by metal layers. In some embodiments, alternating metal layers may be orthogonal to one another. For example, metal layer 1033 is orthogonal to metal layer 1034.

Figure 10D:
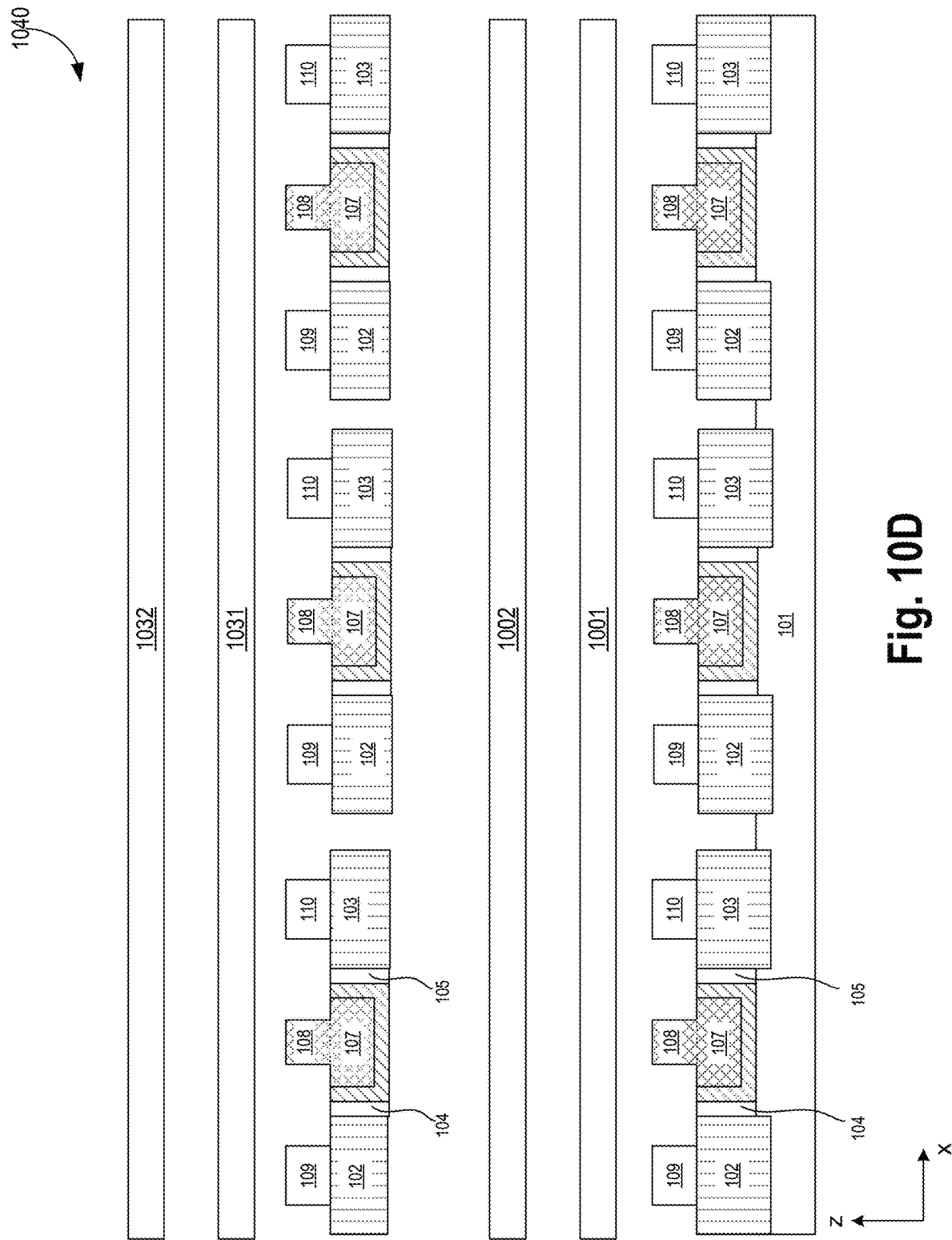

FIG. 10D illustrates cross-sectional view 1040 of two acoustic waveguides, one formed in the frontend and another formed in the backend. In some embodiments, some metal layers used for forming the first acoustic waveguide (e.g., waveguide near the frontend) can also be used for providing Bragg reflectors for the backend FE gate dielectric based transistors. Other modifications and alternatives described with reference to other embodiments are also applicable here. For example, metal layers can be formed along the sides of the transistors for further improve the trans-conductance of the resonating signals.

Figure 10E:
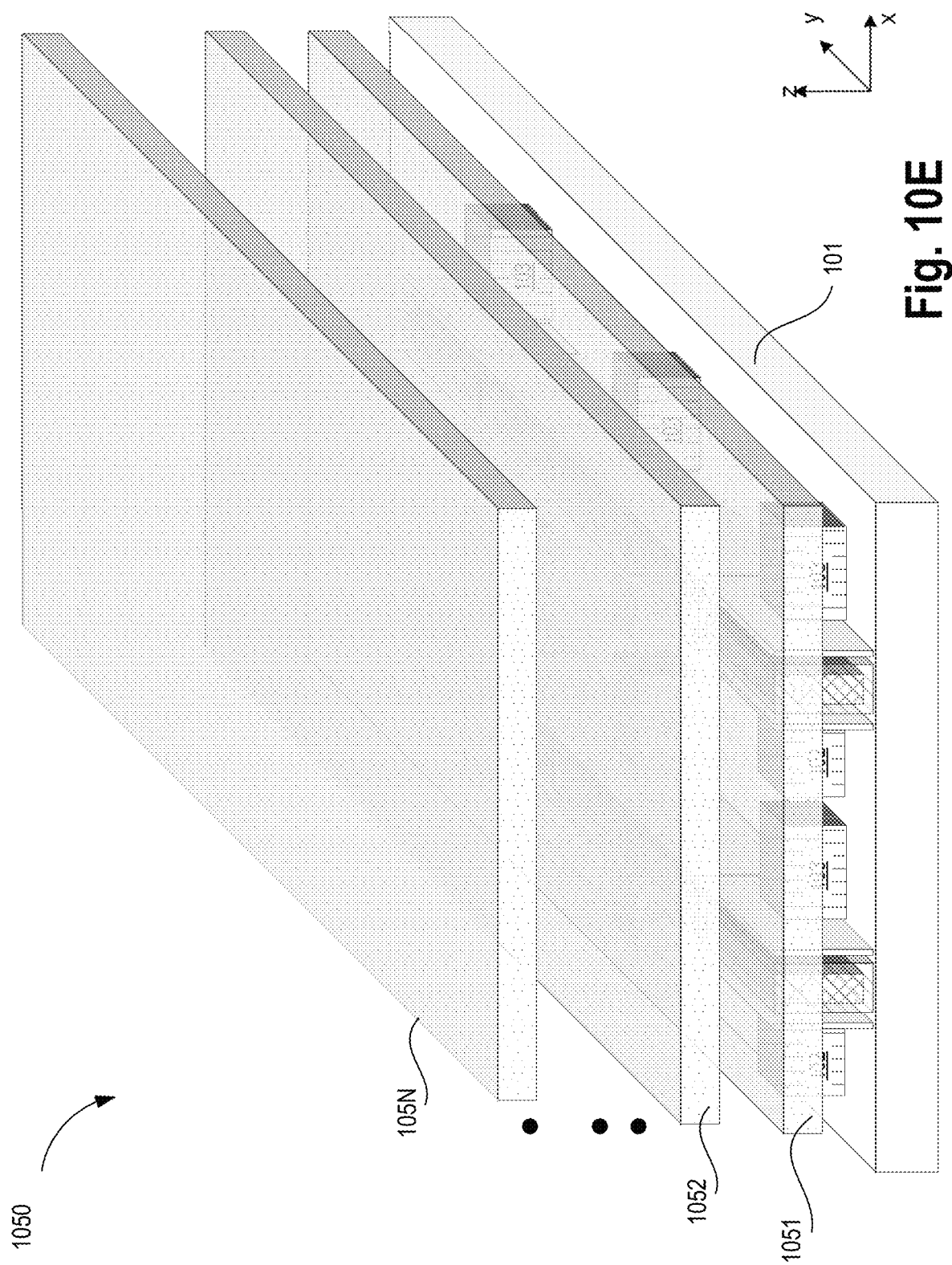

FIG. 10E illustrates another acoustic waveguide 1050. Compared to FIG. 10A, here metal layers 1051, 1052, through 105N (where 'N' is a number greater than 2) are formed on top of one another covering the resonating transistors. Here, solid metal layers are used without gaps. These metal layers 1051 through 105N may not couple with one another and may be unbiased. In some embodiments, the metal layers 1051 through 105N are coupled to ground or a power supply.

FIG. 10F illustrates another acoustic waveguide 1060. Compared to FIG. 10A, here metal layers form a mesh such that alternating layers are orthogonal to one another. For example, layer 1002a is orthogonal to layer 1003 and 1001, wherein layers 1003 and 1001 are parallel to one another. Any number of layers can be stacked over the resonating transistors. These metal layers 1001, 1002a, 1003, and so on may not couple with one another and may be unbiased. In some embodiments, these metal layers are coupled to ground or a power supply.

Figure 10G:
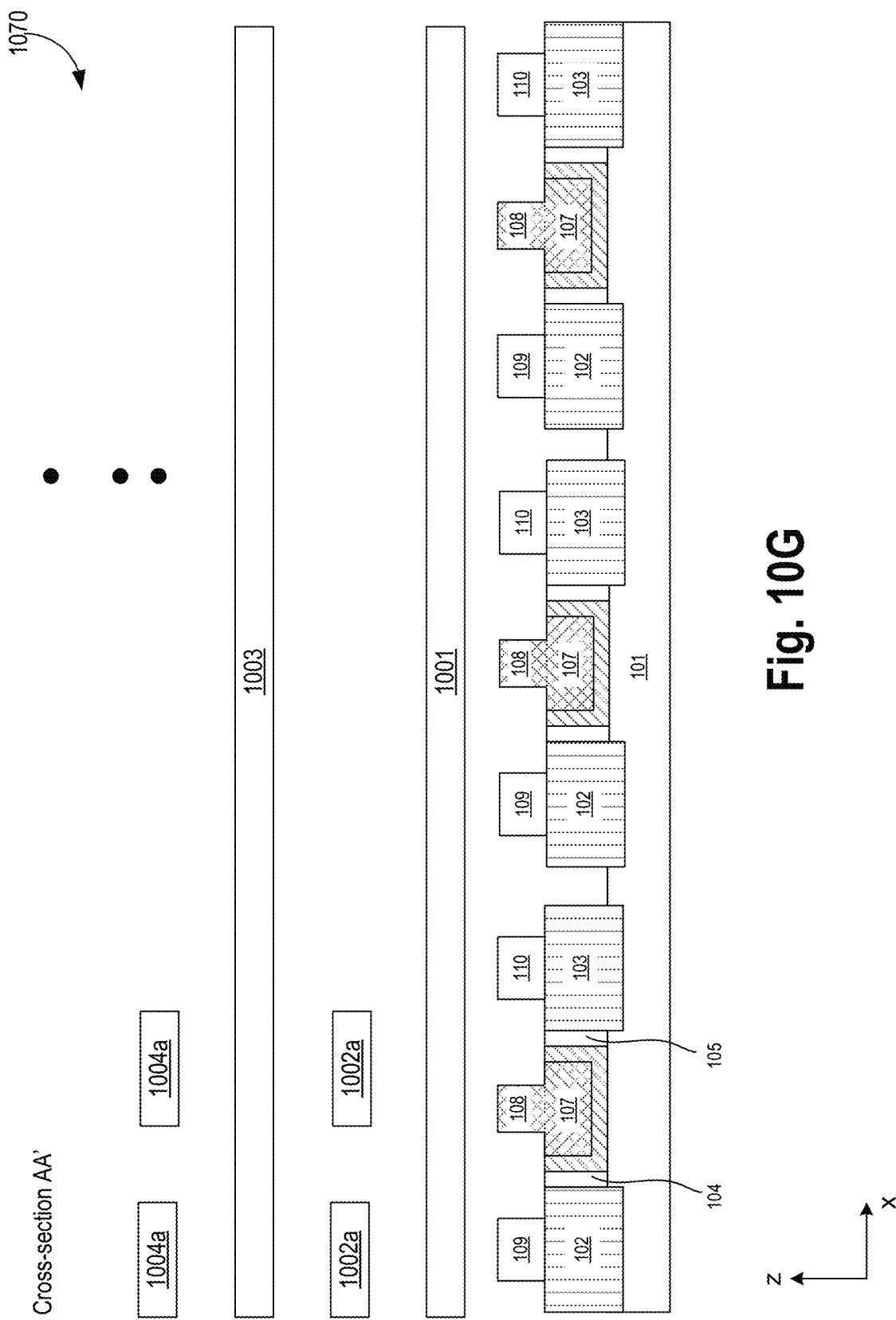

FIG. 10G illustrates cross-section 1070 of the acoustic waveguide 1060 of FIG. 10F. Here, metal layers 1002a and 1004a extend along the y-axis while metal layers 1001 and 1003 extend along the x-axis.

FIGS. 11A-B illustrate cross-section 1100 of an acoustic waveguide and a plot 1110 showing frequency modes, respectively. The plot 1110 shows formation of acoustic phononic crystals above the multi-gate transistor having FE material, in accordance with some embodiments. Cross-section 1100 is similar to cross-section 1020 but along another cut (e.g., along the y-axis).

Plot 1110 shows that adding metal Bragg reflectors make acoustic phononic crystals (PnCs) above the transistors. Four frequency bands are shown in plot 1100. The cut off of the frequency bands (e.g., f1 and f2) depend on the width or height h1, h2, h3 of the interconnects and gaps g1, g2, and so on between the interconnects. The band from frequency 0 to f1 is the first PnC (band (band 1). The band between f1 and f2 is the silicon bandgap. The band between f2 and f3 is the second PnC band (PnC band2). The dotted line shoes the various available frequency modes in substrate 101. As discussed with reference to FIGS. 10C-D, when the FE gate dielectric based transistors are in the backend, reflectors can be formed on the top and on the bottom both. In some embodiments, dummy gates (not shown) with different spacing can be used as reflectors in the plane of the device.

Figure 12:
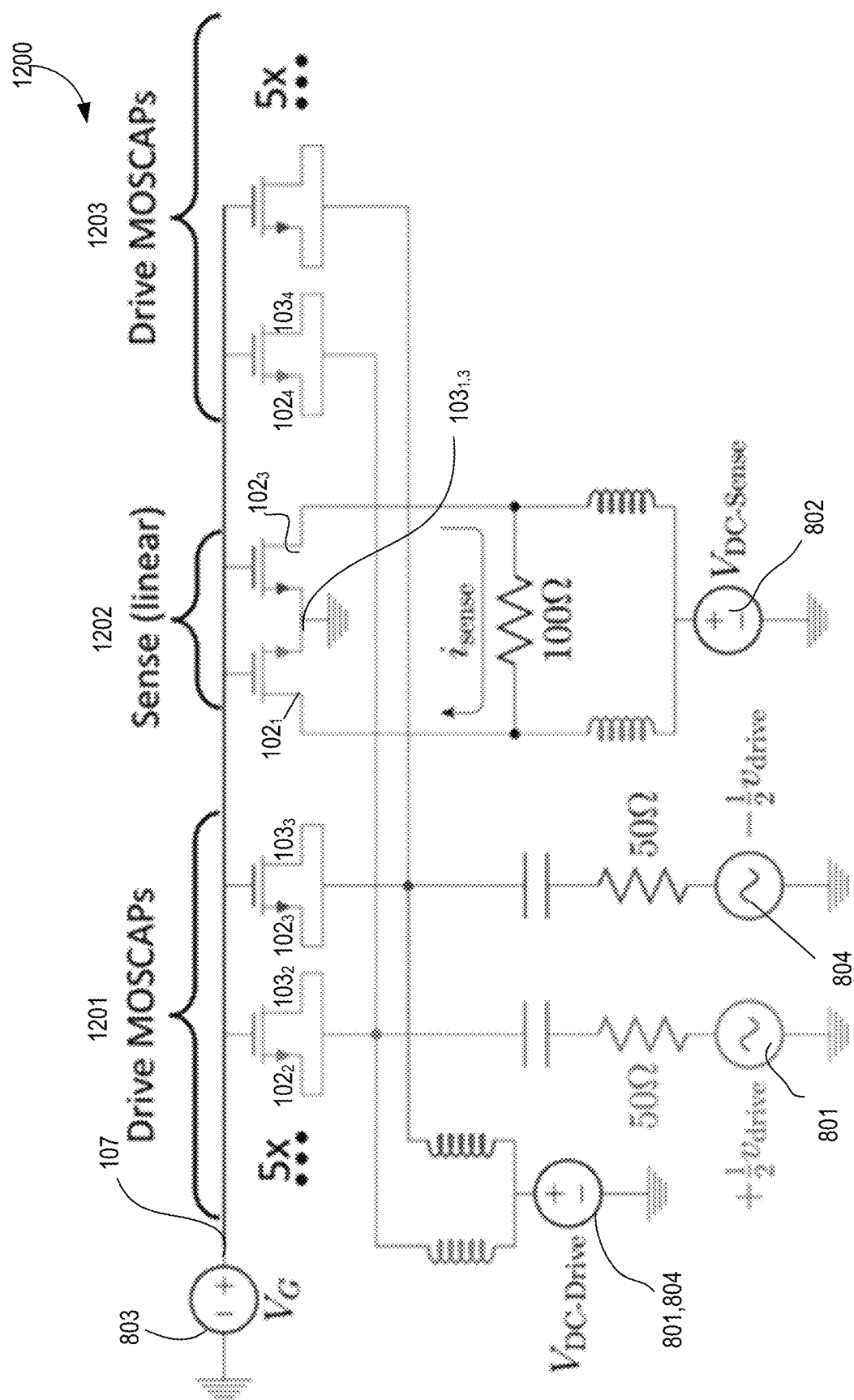
FIG. 12 illustrates a plurality of differential drivers and sensors to provide driving and sensing modes through an array of resonators formed using Bragg reflectors adjacent to a multi-gate transistor having FE material, in accordance with some embodiments.

FIG. 12 illustrates apparatus 1200 showing a plurality of differential drivers and sensors to provide driving and sensing modes through an array of resonators formed using Bragg reflectors adjacent to a multi-gate transistor having FE material, in accordance with some embodiments. Apparatus 1200 is a schematic illustration of FIG. 8A where driving transistors alternate between sensing transistors. Here, two drivers 1201 and 1203 and one sensing circuitry 1202 is shown. The gate terminals 107 of all transistors are biased by source 803. The driving transistors of driver 1201 and diver 1203 are configured as capacitors (MOSFET capacitors) with drain and source terminals coupled together and driven by sources 801 and 804. The sensing transistors have their source terminals coupled to ground and their drain terminals coupled to source 802 to sense the current through them. Any number of alternating driving and sensing circuitries can be used.

Figure 13:
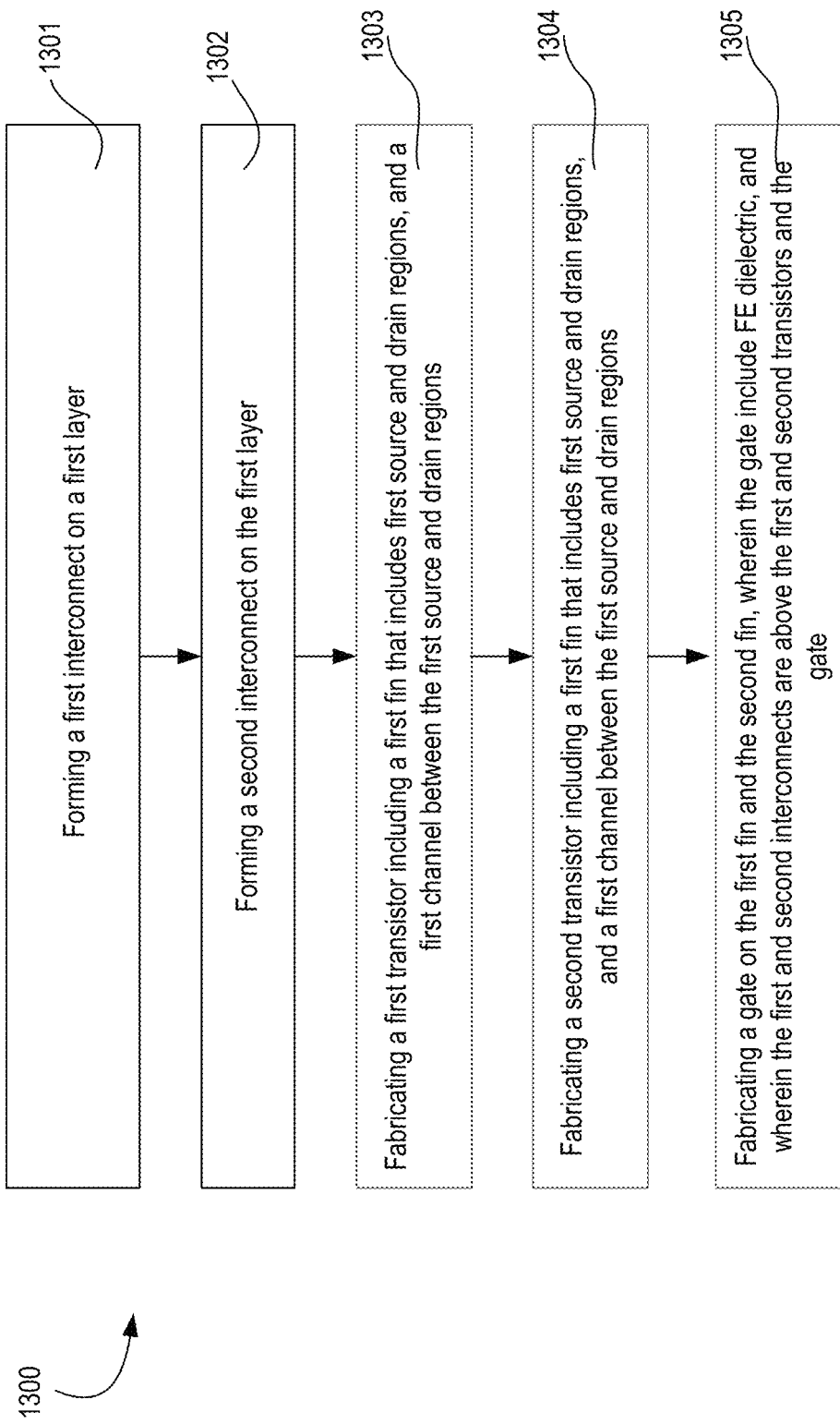
FIG. 13 illustrates a flowchart of a method for forming an acoustic waveguide with Bragg reflectors adjacent to a multi-gate transistor having FE material, in accordance with some embodiments.

FIG. 13 illustrates flowchart 1300 of a method for forming an acoustic waveguide with Bragg reflectors adjacent to a multi-gate transistor having FE material, in accordance with some embodiments. While the following blocks (or process operations) in the flowchart are arranged in a certain order, the order can be changed. In some embodiments, some blocks can be executed in parallel.

At block 1301, a first interconnect (e.g., 1001, 1031) is formed comprising metal (e.g., Cu, Al, Graphene, Cobolt), wherein the first interconnect is on a first layer (e.g., metal layer 4). At block 1302, a second interconnect (e.g., 1002, 1032) is formed comprising metal, wherein the second interconnect is on the first layer and is also parallel to the first interconnect, and wherein the first and second interconnect are not coupled to one another. At block 1303, a first transistor is fabricated including a first fin that includes first source and drain regions, and a first channel between the first source and drain regions. At block 1304, a second transistor is fabricated including a second fin that includes second source and drain regions, and a second channel between the second source and drain regions. At block 1305, a gate is fabricated on the first fin between the first source and drain regions and on the second fin between the second source and drain regions, wherein the gate includes an ferroelectric (FE) gate dielectric; and wherein the first and second interconnects are above the first and second transistors and the nonplanar gate.

In some embodiments, the first and second metal interconnects are unbiased. In some embodiments, the first and second transistors and the gate are positioned in the backend (e.g., FIGS. 10C-D). In some embodiments, the method further comprises fabricating a third interconnect comprising metal, wherein the third interconnect is on a second layer (e.g., metal 1). In some embodiments, the method comprises forming a fourth interconnect (e.g., metal 0) comprising metal, wherein the fourth interconnect is on the second layer and is also parallel to the third interconnect, wherein the third and fourth interconnects are not coupled to one another, and wherein the third and fourth interconnects are below the first and second transistors and the gate.

Figure 14:
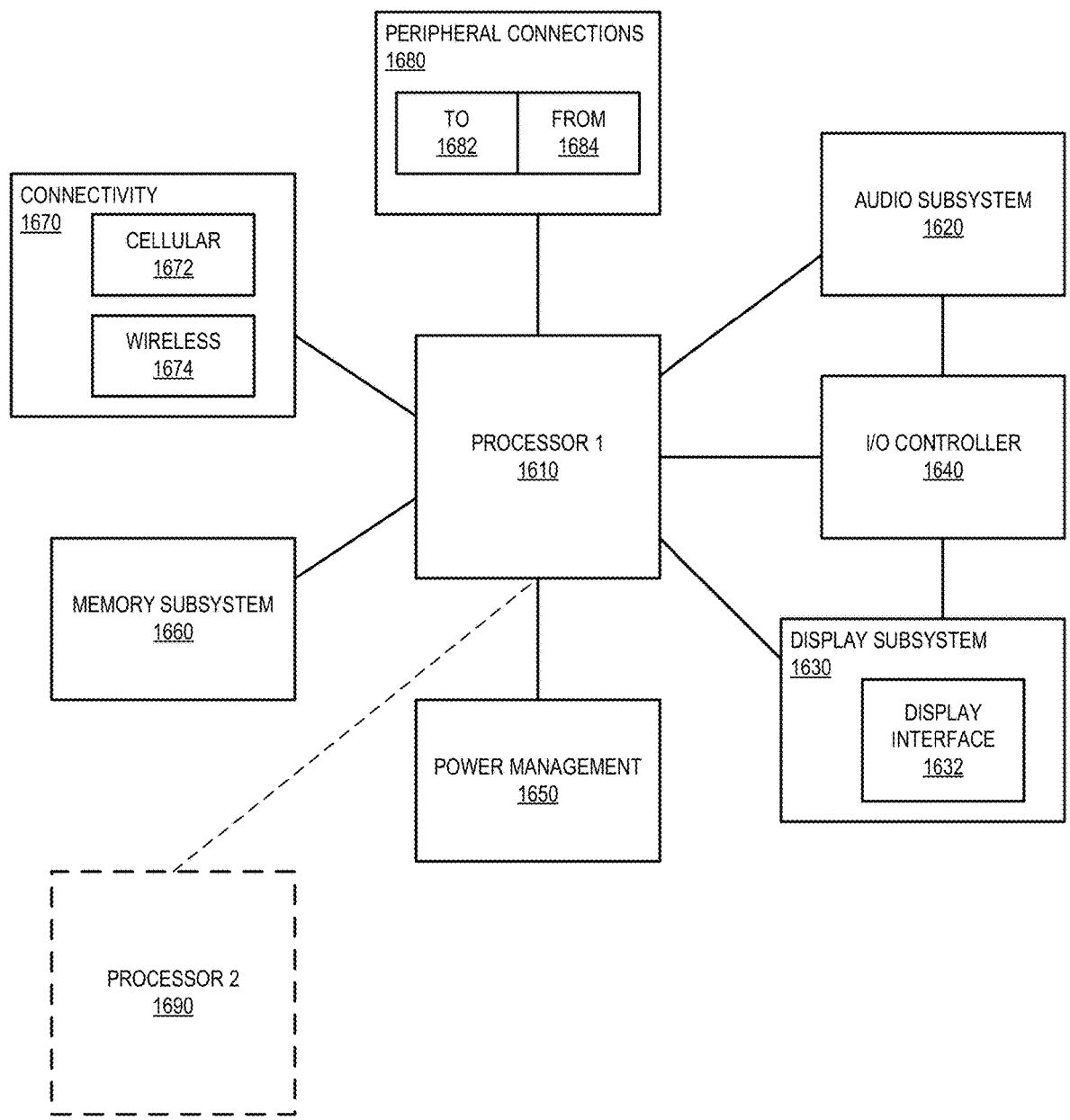
FIG. 14 illustrates a smart device or a computer system or a SoC (System-on-Chip) with an acoustic waveguide with Bragg reflectors adjacent to a multi-gate transistor having FE material, according to some embodiments of the disclosure.

FIG. 14 illustrates a smart device or a computer system or a SoC (System-on-Chip) 1600 with an acoustic waveguide with Bragg reflectors adjacent to a multi-gate transistor having FE material, according to some embodiments of the disclosure.

FIG. 14 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes first processor 1610 with an acoustic waveguide with Bragg reflectors adjacent to a multi-gate transistor having FE material, according to some embodiments discussed. Other blocks of the computing device 1600 may also include one or more devices according to any one of devices of FIGS. 1-12, according to some embodiments. The FE gate dielectric based transistors with metal layers above, below, and/or on the sides provides an acoustic waveguide and a less expensive, stable, and small resonant on-chip device suitable for monolithic integration in SoCs that include radiofrequency (RF) and/or wireless components such as oscillators, filters, and other components that require resonator elements. In some embodiments, a mechanically resonant tri-gate or finFET based resonator is formed with multiple fins per gate. Periodically exciting the FE gate dielectric regions causes periodic Coulombic forces that deflect the gate material in a periodic fashion. Thus, periodically exciting the gate forms a resonant device, such as an oscillator. An embodiment enables a PZR using a CMOS compatible tri-gate or multi-gate process. Embodiments with compact scalable PZRs fabricated in CMOS enable a large range of RF low power mobile and wireless components. The compact oscillators realized by nano-mechanical acoustic resonant devices enable non-Boolean architectures for specialized computing (e.g., pattern recognition applications that rely on synchronized resonance of arrays of oscillators).

Thus, embodiments of CMOS based nano-mechanical resonant devices described herein: (1) provide on chip resonant structures (while avoiding or limiting use of inductors and capacitors), (2) enable circuits with a wide frequency operation range (e.g., 1 GHz-100 GHz and spanning several wireless bands), (3) reduce the number of discrete components needed for wireless and RF applications, and/or (4) enable on chip frequency sources for clocking and non-Boolean computing.

Due to the high Q factor provided by FE gate dielectric materials that form the mechanical acoustic oscillators, the frequency content of the embodiments described herein are stable, have low phase noise, and thereby obviate the need (wholly or partially) for expensive off-chip crystal oscillators for RF circuits (e.g., oscillators, resonators, switches, filters) and/or high speed input/output (I/O) systems. Such embodiments are suitable for, as an example, synchronous logic and microprocessor components requiring inexpensive, highly stable, low jitter, high frequency clock signals in a standard CMOS process. Such embodiments may also be used in, for example, narrowband RF switches or filters at high frequency.

An embodiment includes fins of varying lengths to provide tunable/multi-mode oscillators with select/switched resonator features. Different PZR pitch arrangements may also provide for tunable resonators. For example, a multiplexor may be used to vary the sense nodes and the actuating nodes discussed with reference to various embodiments.

For example, in a first orientation every fin may be used for actuation, in a second orientation every other fin may be used for actuation, and in a third orientation every third fin may be used for actuation—all resulting in a user-selectable range of tunable resonant frequencies. This produces PZRs having different resonant frequencies. Various PZRs may be combined together to create re-configurable oscillators that oscillate at different frequencies, where the oscillator of a non-desired frequency can be easily switched on or off via switches coupled to the source/drains of tri-gate FETs in the PZRs. By using different combinations of PZRs, an embodiment provides frequency tuning capabilities.

At times, the gate 107 is symmetrically formed about the fin(s) and provides symmetrical sidewall forces for resonance. In other words, the forces applied to the side walls of the fin(s) are symmetric because the gate is disposed symmetrically along the sides of the fin(s). However, in other embodiments the gate 107 may not be so disposed and may instead be asymmetrically formed on the fin(s) sidewalls and consequently provide asymmetric forces that may cause the fin(s) to resonate in-plane, out-of-plane, or in a hybrid fashion between in-plane and out-of-plane resonance.

Various embodiments described herein use PZRs that provide high-Q, on-chip resonators compatible with multi-gate (e.g., tri-gate) transistor process technology. Such on-chip resonators are used for 10's of GHz RF filters and oscillators and/or novel computing systems such as the pattern recognition by synchronization of coupled nano-oscillators (i.e., non-Boolean computing). Consequently, PZRs provide improvements over RF filters realized by FBARs, which are off-chip elements that require special packaging. Further, embodiments provide improvements over coupled nano-oscillators for non-Boolean computing that include RBTs and/or resonant body oscillators (RBOs).

The various embodiments of the present disclosure may also comprise a network interface within 1670 such as a wireless interface so that a system embodiment may be incorporated into a wireless device, for example, cell phone or personal digital assistant.

In some embodiments, processor 1610 (and/or processor 1690) can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In some embodiments, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

In some embodiments, computing device 1600 comprises display subsystem 1630. Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

In some embodiments, computing device 1600 comprises I/O controller 1640. I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In some embodiments, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In some embodiments, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

In some embodiments, computing device 1600 comprises connectivity 1670. Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

In some embodiments, computing device 1600 comprises peripheral connections 1680. Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus, comprising:
    a first transistor comprising a first fin comprising a first channel region between first source and drain regions;
    a second transistor comprising a second fin comprising a second channel region between second source and drain regions;
    gate coupled to the first and second channel regions, wherein the gate comprises a ferroelectric (FE) gate dielectric, and wherein the first and second transistors and the gate are positioned in a backend of the apparatus;
    first and second interconnects on a first layer and parallel to one another, wherein the first and second interconnect are not coupled to one another; and
    third and fourth interconnects on a second layer and parallel to one another, wherein the third and fourth interconnect are not coupled to one another, wherein the first and second interconnects are above the first and second transistors, and wherein the third and fourth interconnects are below the first and second transistors.

2. The apparatus of claim 1, wherein the FE gate dielectric comprises O and Hf.

3. The apparatus of claim 2, wherein the FE gate dielectric is doped with a dopant comprising one of silicon, zirconium, lanthanum, or aluminum.

4. The apparatus of claim 3, wherein the dopant has a concentration between about 3% and 30% by weight.

5. The apparatus of claim 1, wherein the gate comprises a gate electrode on the FE gate dielectric, wherein the gate electrode comprises one or more of Ti, N, or Al.

6. The apparatus of claim 5, further comprising:
a direct current (DC) contact, to receive a DC current, coupled to the gate electrode and further coupled to at least one of the first and second fins; and
an alternating current (AC) contact, to receive an AC current, coupled to at least one of the gate electrode, the first fin, and the second fin.

7. The apparatus of claim 6, wherein the DC contact is coupled to the first fin and the AC contact is coupled to the gate.

8. The apparatus of claim 6, wherein the gate electrode is to mechanically resonate at a first frequency in response to the gate being actuated by the AC current, from the AC contact, to generate periodic forces on the gate electrode.

9. The apparatus of claim 6, further comprising a circuitry to sense the first frequency.

10. The apparatus of claim 6, wherein:
the DC and AC contacts are each coupled to the first fin,
the DC contact is coupled to the first and second fins and the AC contact is coupled to the gate, or
the DC contact is coupled to the second fin and the AC contact is coupled to the first fin.

11. The apparatus of claim 6, further comprising:
AC and DC sources that respectively couple to the AC and DC contacts to provide the AC and DC currents.

12. The apparatus of claim 1, wherein the first and second interconnects are unbiased.

13. The apparatus of claim 1, further comprising:
a processor coupled to a memory, wherein the processor comprises an acoustic resonator comprising the first and second transistors, the gate, and the first, second, third, and fourth interconnects; and
a communication interface to allow the processor to communicate with another device.

14. An apparatus comprising:
a first interconnect comprising metal, wherein the first interconnect is on a first layer;
a second interconnect comprising metal, wherein the second interconnect is on the first layer and is parallel to the first interconnect, wherein the first and second interconnect are not coupled to one another;
a first transistor comprising a first fin comprising first source and drain regions, and a first channel between the first source and drain regions;
a second transistor comprising a second fin comprising second source and drain regions, and a second channel between the second source and drain regions;
a gate on the first fin between the first source and drain regions and on the second fin between the second source and drain regions, wherein the first and second transistors and the gate are positioned in a backend of the apparatus;
a third interconnect comprising metal, wherein the third interconnect is on a second layer; and
a fourth interconnect comprising metal, wherein the fourth interconnect is on the second layer and is parallel to the third interconnect, wherein the third and fourth interconnects are not coupled to one another,
wherein the gate comprises a ferroelectric (FE) gate dielectric,
wherein the first and second interconnects are above the first and second transistors and the gate, and
wherein the third and fourth interconnects are below the first and second transistors and the gate.

15. The apparatus of claim 14, wherein the FE gate dielectric comprises O and Hf.

16. The apparatus of claim 15, wherein the FE gate dielectric is doped with a dopant comprising one of silicon, zirconium, lanthanum, or aluminum.

17. The apparatus of claim 14, wherein the gate comprises a gate electrode on the FE gate dielectric, wherein the gate electrode comprises one or more of Ti, N, or Al.

18. The apparatus of claim 17, further comprising:
a direct current (DC) contact, to receive a DC current, coupled to the gate electrode and further coupled to at least one of the first and second fins; and
an alternating current (AC) contact, to receive an AC current, coupled to at least one of the gate electrode, the first fin, and the second fin.

19. The apparatus of claim 17, wherein the DC contact is coupled to the first fin and the AC contact is coupled to the gate.

20. The apparatus of claim 17, wherein the gate electrode is to mechanically resonate at a first frequency in response to the gate being actuated by the AC current, from the AC contact, to generate periodic forces on the gate electrode.

21. The apparatus of claim 17, further comprising circuitry to sense the first frequency.

22. The apparatus of claim 17, wherein:
the DC and AC contacts are each coupled to the first fin,
the DC contact is coupled to the first and second fins and the AC contact is coupled to the gate, or
the DC contact is coupled to the second fin and the AC contact is coupled to the first fin.

23. The apparatus of claim 17, further comprising:
AC and DC sources that respectively couple to the AC and DC contacts to provide the AC and DC currents.

24. The apparatus of claim 14, wherein the first and second interconnects are unbiased.

25. The apparatus of claim 14, further comprising:
a processor coupled to a memory, wherein the processor comprises an acoustic resonator comprising the first and second transistors, the gate, and the first, second, third, and fourth interconnects; and
a communication interface to allow the processor to communicate with another device.

* * * * *